(12) United States Patent
Kawano

(10) Patent No.: US 6,881,666 B2
(45) Date of Patent: Apr. 19, 2005

(54) METHOD OF FABRICATING SEMICONDUCTOR DEVICE

(75) Inventor: Masaya Kawano, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/386,424

(22) Filed: Mar. 13, 2003

(65) Prior Publication Data
US 2003/0181032 A1 Sep. 25, 2003

(30) Foreign Application Priority Data
Mar. 20, 2002 (JP) ........................................ 2002-077625

(51) Int. Cl.⁷ .......................................... H01L 21/4763
(52) U.S. Cl. ...................... 438/637; 438/638; 438/660; 438/672; 438/687
(58) Field of Search ................................ 438/633, 637, 438/638, 643, 653, 660, 672, 675, 687

(56) References Cited

U.S. PATENT DOCUMENTS 5,665,659 A * 9/1997 Lee et al. .................... 438/646
6,368,967 B1 * 4/2002 Besser ......................... 438/687
6,441,489 B1 * 8/2002 Motoyama ................... 257/751

FOREIGN PATENT DOCUMENTS

JP  2001-160590  6/2001

OTHER PUBLICATIONS

Hobbs, A., et al., "Evolution of Grain and Micro–Void Structure in Electroplated Copper Interconnection Lines", Technical Report of IEICE, pp. 23–28 (Jan. 2001).

* cited by examiner

Primary Examiner—Hsien Ming Lee
(74) Attorney, Agent, or Firm—Whitham, Curtis & Christofferson, PC

(57) ABSTRACT

A method of fabricating a semiconductor device, including at least the steps of (a) forming a via-hole or trench throughout an electrically insulating layer, (b) forming a wiring material layer on the electrically insulating layer such that the via-hole or trench is filled with the wiring material layer, (c) annealing the wiring material layer, (d) cooling the wiring material layer down to a temperature equal to or lower than a predetermined temperature, and (e) applying chemical mechanical polishing (CMP) to the wiring material layer such that the wiring material layer exists only in the via-hole or trench. The step (c) is carried out prior to the step (e), and the step (d) is carried out after the step (c).

37 Claims, 17 Drawing Sheets

ANNEALING + COOLING

ANNEALING

ANNEALING

ANNEALING + COOLING

ANNEALING + COOLING

ANNEALING + COOLING

ANNEALING + COOLING

ANNEALING + COOLING

ANNEALING

⇩ ANNEALING ⇩

⇩ FORMING ELECTRODE PADS
⇩ POLISHING WAFER
⇩ DICING WAFER
⇩ PACKAGING & BONDING

COOLING

METHOD OF FABRICATING SEMICONDUCTOR DEVICE

BACKGROUND OF THE INVENTION

1. Field of the Invention

The invention relates to a method of fabricating a semiconductor device, and more particularly to a damascene process for enhancing reliability in electrical connection among multi-layered wiring layers.

2. Description of the Related Art

As a semiconductor device is fabricated these days in higher integration and in a smaller size, a wiring layer is formed in a smaller size, and a multi-layered structure is selected in a greater number of semiconductor devices. As one of methods of fabricating a multi-layered structure, a damascene process is generally selected. A damascene process generally includes the steps of forming a via-hole or trench throughout an electrically insulating film formed on a substrate, depositing an electrically conductive material on the electrically insulating film such that the via-hole or trench is filled with the electrically conductive material, and applying chemical mechanical polishing (CMP) to the electrically conductive material to thereby form a via-contact or wiring in the via-hole or trench. A damascene process is suitable for fabricating a multi-layered structure composed of copper or an alloy thereof, because it is quite difficult to accurately etch a copper layer.

FIGS. 1A to 1F are cross-sectional views of a semiconductor device, illustrating respective steps of a via-first dual damascene process which is one of conventional damascene processes.

First, as illustrated in FIG. 1A, a first etching stopper layer 2 is formed on a substrate 1 on which a device such as a MOS transistor has been already fabricated. The first etching stopper layer 2 acts as an etching stopper to a later mentioned first wiring trench 3a.

Then, a first interlayer insulating film 3 is formed entirely over the first etching stopper film 2.

Then, a resist film (not illustrated) is formed on the first interlayer insulating film 3, and then, is patterned.

Then, the first interlayer insulating film 3 and the first etching stopper layer 2 are dry-etched with the patterned resist film being used as a mask, to thereby form a first wiring trench 3a.

Then, as illustrated in FIG. 1B, a barrier metal film 4 acting as an underlying film for a lower wiring layer is formed by sputtering entirely over the first interlayer insulating film 3 and an exposed area of the substrate 1.

Then, a seed metal film (not illustrated) is formed on the barrier metal film 4 by sputtering for facilitating growth of electroplated copper.

Then, copper 5a which will make a lower wiring layer is deposited over the barrier metal film 4 by electrolytic plating, as illustrated in FIG. 1B.

Then, the resultant illustrated in FIG. 1B is annealed at a temperature in the range of about 200 to 400 degrees centigrade to improve crystallinity of the copper 5a.

Then, as illustrated in FIG. 1C, the copper 5a and the barrier metal film 4 are polished by chemical mechanical polishing (CMP) until the first interlayer insulating film 3 appears. Thus, there is formed a lower wiring layer 5 comprised of the copper 5a filling the first wiring trench 3a therewith.

Then, as illustrated in FIG. 1D, a first cap film 6 acting as a barrier for preventing diffusion of the lower wiring film 5, a via interlayer insulating film 7, a second etching stopper film 10 acting as an etching stopper to a later mentioned second wiring trench 11a, and a second interlayer insulating film 11 are formed in this order on the resultant illustrated in FIG. 1C.

Then, a resist film (not illustrated) is formed on the second interlayer insulating film 11, and then, is patterned.

Then, the second interlayer insulating film 11, the second etching stopper film 10 and the via interlayer insulating film 7 are etched with the patterned resist film being used as a mask, to thereby form a via-hole 9a throughout them.

Then, a resist film (not illustrated) is formed again on the second interlayer insulating film 11, and then, is patterned.

Then, the second interlayer insulating film 11 is etched with the patterned resist film being used as a mask, to thereby form a second wiring trench 11a throughout the second interlayer insulating film 11.

Then, the second etching stopper film 10 and the first cap film 6 are removed in their exposed areas.

Then, as illustrated in FIG. 1E, a barrier metal film 12 acting as an underlying film for an upper wiring layer is formed by sputtering entirely over the second interlayer insulating film 11, the via interlayer insulating film 7 and the exposed lower wiring layer 5.

Then, a seed metal film (not illustrated) is formed on the barrier metal film 12 by sputtering for facilitating growth of electroplated copper.

Then, copper 13a which will make an upper wiring layer is deposited over the barrier metal film 12 by electrolytic plating, as illustrated in FIG. 1E.

Then, the resultant illustrated in FIG. 1E is annealed at a temperature in the range of about 200 to 400 degrees centigrade to improve crystallinity of the electroplated copper 13a.

Then, as illustrated in FIG. 1F, the copper 13a is polished by chemical mechanical polishing (CMP) until the second interlayer insulating film 11 appears. Thus, there are simultaneously formed an upper wiring layer 13 comprised of the copper 13a filling the second wiring trench 11a therewith, and a via-contact 9 comprised of the copper 13a filling the via-hole 9a therewith.

Thereafter, the steps having been explained with reference to FIGS. 1D to 1F are repeatedly carried out to thereby fabricate a semiconductor device having a desired multi-layered structure.

In the above-mentioned damascene process, the resultant illustrated in FIG. 1B or 1E is annealed at a temperature in the range of about 200 to 400 degrees centigrade before the copper 5a or 13a is polished by CMP, in order to improve crystallinity of the copper 5a or 13a filling the first wiring trench 3a, the via-hole 9a and the second wiring trench 11a therewith. The annealing carried out at such a high temperature results in residual tensile stress in the via-contact 9 or the first and second wiring layers 5 and 13 due to plastic deformation of the copper 5a or 13a, if the via-contact 9 or the first and second wiring layers 5 and 13 is returned back to a room temperature. Such residual tensile stress is of about 300 MPa. The residual tensile stress further causes a problem that the lower or upper wiring layer 5 or 13 is partially broken in the CMP process.

Even if the multi-layered structure as illustrated in FIG. 1F was packaged as a semiconductor chip, since residual tensile stress remains as it is in the lower or upper wiring layer 5 or 13, various defects due to stress migration, such as disconnection between the via-contact 9 and the upper wiring layer 13, may occur in the future.

Hereinbelow is explained disconnection caused by stress migration, with reference to FIGS. 2 and 3A to 3C. FIG. 2 is a cross-sectional view of a wiring structure, illustrating a defect which might occur in a wiring structure fabricated in accordance with a single damascene process, and FIGS. 3A to 3C are cross-sectional views of a wiring structure, each illustrating a defect which might occur in a wiring structure fabricated in accordance with a dual damascene process.

As illustrated in FIG. 2, residual tensile stress caused by annealing carried out at a high temperature remains in the lower wiring layer 5, the via-contact 9 and the upper wiring layer 13 in a wiring structure fabricated in accordance with a single damascene process. The residual tensile stress causes a problem that the copper moves in a direction indicated with arrows at the grain boundary 14 due to stress migration, and resultingly, there is generated a void 15 at the grain boundary 14. In particular, when the residual tensile stress is concentrated in an area in which the grain boundary 14 intersects with the barrier metal film 12 at a bottom of the via-contact 9, the void 15 grows with the result of disconnection between the lower wiring layer 5 and the via-contact 9. This causes inability of operation of a semiconductor device.

As illustrated in FIG. 3A, residual tensile stress remains in the lower wiring layer 5, the via-contact 9 and the upper wiring layer 13 in a wiring structure fabricated in accordance with a dual damascene process. In particular, since the residual tensile stress is directed toward the upper wiring layer 13 in the via-contact 9, a void 15 is likely to grow in an area in which the grain boundary 14 intersects with the barrier metal film 12 at a bottom of the via-contact 9.

As illustrated in FIGS. 3B and 3C, the residual tensile stress is concentrated in the via-contact 9 in a wiring structure including the via-contact 9 and the upper wiring layer 13 both formed integrally with each other. As a result, a void 15 may be generated at a bottom of the barrier metal film 12, if the copper of which the via-contact 9 is composed makes poor adhesion with the barrier metal film 12, as illustrated in FIG. 3B, or a void 15 may separate the via-contact 9 into two portions, if the grain boundary 14 horizontally extends across the via-contact 9, as illustrated in FIG. 3C. In both cases, the upper wiring layer 13 cannot make sufficient electrical contact with the lower wiring layer 5.

In a wiring structure fabricated in accordance with a dual damascene process, which defect occurs among the defects illustrated in FIGS. 3A to 3C is dependent on whether there exists the grain boundary 14, in what density the via-hole 9a is filled with copper, and other factors. If the via-hole 9a is not sufficiently filled with copper, the defect illustrated in FIG. 3B or 3C would occur rather than the defect illustrated in FIG. 3A.

In order to prevent occurrence of the defects illustrated in FIGS. 3A to 3C, the upper and lower wiring layers 13 and 5 may be designed to have a greater width, or the via-contact 9 may be designed to have a greater aspect ratio.

However, a greater width of the upper and lower wiring layers 13 and 5 and a greater diameter of the via-contact 9 are contrary to a requirement of fabricating a semiconductor device in a possibly smaller size. If the via-contact 9 is designed to have a smaller height, a problem of wiring delay will be caused by a parasitic capacitance between the upper and lower wiring layers 13 and 5.

In order to reduce residual tensile stress in wiring layers and a via-contact to thereby avoid the above-mentioned problems, Japanese Patent Application Publication No. 2001-160590 has suggested a method of fabricating a semiconductor device including the step of annealing copper at a temperature in the range of 80 to 200 degrees centigrade, whereas copper is annealed usually at a temperature in the range of 200 to 400 degrees centigrade.

In a step of heating electroplated copper up to 420 degrees centigrade from a room temperature in the suggested method, it is observed that a stress varies due to diffusion creep in accordance with thermal expansion at a temperature in the range of a room temperature and 200 degrees centigrade, whereas it is observed that a stress is relaxed due to rapid diffusion of copper at a temperature in the range of 200 to 420 degrees centigrade. Relaxation of a stress which occurred at a high temperature remains as it is, even if the plate copper is cooled down to a room temperature. At a room temperature, a wiring layer or a via-contact has a reverse stress, that is, a compressive stress.

According to the Publication, if the electroplated copper is annealed at 200 degrees centigrade or lower, the copper expands in a trench and a via-hole, and simultaneously, copper grain is facilitated to grow and a void is facilitated to be generated, however, by cooling the copper down to a room temperature, the copper is densified and a stress is relaxed with the result that the copper existing in a trench remains unchanged with respect to a volume even after polished by CMP, and that the residual tensile stress can be reduced.

It might be possible to reduce the residual tensile stress in a trench and a via-hole to some degree in accordance with the method suggested in the Publication. However, there is newly caused another problem that if copper is annealed at a temperature in the range of 80 to 200 degrees centigrade, which is lower than a range of a temperature at which copper is usually annealed, the copper would have a smaller diameter, resulting in that there are generated a lot of paths through which the copper is diffused, and a resistance to electromigration is reduced.

In a process of fabricating a semiconductor device, a high-temperature step is carried out a plurality of times for applying plasma to a substrate, or forming an electrically insulating film, for instance. Hence, even if copper is annealed at a relatively low temperature immediately after the copper has been plated into a trench or a via-hole, the residual tensile stress remains as it is in a wiring layer or a via-contact, if a semiconductor device is exposed to a relatively high temperature in a subsequent step. Accordingly, it is suggested in the above-mentioned Publication that steps to be carried out after a step of forming a copper wiring layer are carried out at 400 degrees or lower.

However, such an upper limit in a temperature would render a process of fabricating a semiconductor device complex, and reduce a yield in fabrication of a semiconductor device.

SUMMARY OF THE INVENTION

In view of the above-mentioned problems in the conventional method of fabricating a semiconductor device, it is an object of the present invention to provide a method of fabricating a semiconductor device, which method is capable of relaxing residual tensile stress remaining in a wiring layer or a via-contact, and reducing defects caused by voids having generated in a wiring layer and/or a via-contact.

In one aspect of the present invention, there is provided a method of fabricating a semiconductor device, including at least the steps of (a) forming a via-hole or trench throughout an electrically insulating layer, (b) forming a wiring material layer on the electrically insulating layer such that the via-hole or trench is filled with the wiring material layer, (c) annealing the wiring material layer, (d) cooling the wiring material layer down to a temperature equal to or lower than a predetermined temperature, and (e) applying chemical mechanical polishing (CMP) to the wiring material layer such that the wiring material layer exists only in the via-hole or trench, wherein the step (c) is carried out prior to the step (e), and the step (d) is carried out after the step (c).

For instance, the predetermined temperature may be a room temperature.

It is preferable that the predetermined temperature is equal to about −75 degrees centigrade, and the step (d) is carried out after the step (c), but prior to the step (e), in which case, it is preferable that the step (c) is carried out at 200 degrees centigrade or higher.

It is preferable that the predetermined temperature is equal to about −100 degrees centigrade, and the step (d) is carried out after the step (e), in which case, it is preferable that the step (c) is carried out at 200 degrees centigrade or higher.

It is preferable that the predetermined temperature is equal to about −196 degrees centigrade, and the step (d) is carried out after the step (e), in which case, it is preferable that the step (c) is carried out at 200 degrees centigrade or higher.

There is further provided a method of fabricating a semiconductor device, including at least the steps, in sequence, of (a) forming an electrically insulating film on a substrate, (b) forming a via-hole or trench throughout the electrically insulating film, (c) forming a barrier metal the via-hole or trench, (d) depositing a material of which a wiring layer is composed, on the electrically insulating film such that the via-hole or trench is filled with the material, (e) annealing a resultant resulted from the step (d), (f) cooling a resultant resulted from the step (e) down to a temperature equal to or smaller than a predetermined temperature, and (g) applying chemical mechanical polishing (CMP) to the material such that the material exists only in the via-hole or trench as a wiring layer.

It is preferable that the predetermined temperature is equal to about −75 degrees centigrade, about −100 degrees centigrade or about −196 degrees centigrade, in which case, it is preferable that the step (e) is carried out in the range of 200 degrees centigrade to 400 degrees centigrade both inclusive.

It is preferable that the material is selected from copper (Cu) or tungsten (W), and the barrier metal film is comprised of a layer composed of a material selected from Ti, TiN, Ta, TaN and WN, or a multi-layered structure including at least two layers each composed of a material selected from Ti, TiN, Ta, TaN and WN.

There is still further provided a method of fabricating a semiconductor device, including at least the steps, in sequence, of (a) forming first to N-th electrically insulating films on a substrate wherein N is an integer equal to or greater than two (2), (b) forming a via-hole or trench throughout the first to N-th electrically insulating films, (c) forming trenches throughout second to N-th electrically insulating films, (d) forming barrier metal films on inner walls of the via-hole or trench and the trenches, (e) depositing a material of which a wiring layer is composed, on the N-th electrically insulating film such that the via-hole or trench and the trenches are filled with the material, (f) annealing a resultant resulted from the step (e), (g) cooling a resultant resulted from the step (f) down to a temperature equal to or smaller than a predetermined temperature, and (h) applying chemical mechanical polishing (CMP) to the material such that the material exists only in the via-hole or trench and the trenches as wiring layers.

There is yet further provided a method of fabricating a semiconductor device, including at least the steps of (a) forming an electrically insulating film on a substrate, (b) forming a via-hole or trench throughout the electrically insulating film, (c) forming a barrier metal film on an inner wall of the via-hole or trench, (d) depositing a material of which a wiring layer is composed, on the electrically insulating film such that the via-hole or trench is filled with the material, (e) annealing a resultant resulted from the step (d), (f) applying chemical mechanical polishing (CMP) to the material such that the material exists only in the via-hole or trench as a wiring layer, and (g) cooling a resultant resulted from the previous step down to a temperature equal to or smaller than a predetermined temperature, wherein the step (g) is carried out at least once after the step (f), but prior to a step of packaging a resultant.

There is still yet further provided a method of fabricating a semiconductor device, including at least the steps of (a) forming first to N-th electrically insulating films on a substrate wherein N is an integer equal to or greater than two (2), (b) forming a via-hole or trench throughout the first to N-th electrically insulating films, (c) forming trenches throughout second to N-th electrically insulating films, (d) forming barrier metal films on inner walls of the via-hole or trench and the trenches, (e) depositing a material of which a wiring layer is composed, on the N-th electrically insulating film such that the via-hole or trench and the trenches are filled with the material, (f) annealing a resultant resulted from the step (e), (h) applying chemical mechanical polishing (CMP) to the material such that the material exists only in the via-hole or trench and the trenches as wiring layers, and (g) cooling a resultant resulted from the previous step down to a temperature equal to or smaller than a predetermined temperature, wherein the step (g) is carried out at least once after the step (f), but prior to a step of packaging a resultant.

In the method of fabricating a semiconductor device in accordance with the present invention, a semiconductor device is annealed at a temperature without limiting an upper limit in both a step to be carried out just after copper has been plated into a trench or a via-hole and subsequent steps. Instead, the method is designed to additionally include the step of cooling a semiconductor device down to a temperature equal to or lower than a predetermined temperature such as a room temperature, ensuring that residual tensile stress remaining in a copper wiring layer or in a via-contact can be relaxed, and hence, wiring defects can be reduced.

The step of cooling a semiconductor device down to a temperature equal to or lower than a predetermined temperature may be carried out after the step of annealing a semiconductor device, or after any one of steps forming pads, packaging a semiconductor device, and forming bonding wires.

A temperature at which a semiconductor device is cooled is determined in accordance with a shape of copper, that is, whether copper is in the form of a flat film or a pattern having a small width. For instance, since the copper is in the form of a flat film immediately after the copper is plated into a trench or a via-hole, and a relatively low residual tensile stress remains in the copper at a room temperature, a semiconductor device may be cooled at −75 degrees centigrade or lower. In contrast, since the copper is in the form of a minute pattern in any one of steps of forming pads, packaging a semiconductor device and forming bonding wires, and a relatively high residual tensile stress remains in the copper at a room temperature, a semiconductor device may be cooled at −100 degrees centigrade or lower, and preferably at −196 degrees centigrade or lower. Herein, a temperature of −196 degrees centigrade means a temperature of liquid nitrogen.

Merely by additionally carrying out the step of cooling a semiconductor device after the step of annealing a semiconductor device, or after any one of steps forming pads, packaging a semiconductor device, and forming bonding wires, it would be possible to relax residual tensile stress in the copper, ensuring reduction in defects such as disconnection between wiring layers.

In addition, it is not necessary in the method in accordance with the present invention to define an upper limit in the step of annealing a semiconductor device, it would not be necessary to change conditions for carrying out a process of fabricating a semiconductor device, and it would be possible to avoid reduction in a yield in fabrication of a semiconductor device.

In a preferred embodiment in accordance with the present invention, a material of which a wiring layer is composed, such as Cu or W, is deposited into a via-hole or a trench formed throughout an electrically insulating film by plating. Then, the material is annealed at a temperature in the range of 200 to 400 degrees centigrade. Then, the material is cooled at −75 degrees centigrade or lower. Then, the material is polished by CMP to thereby form a via-contact or wiring layer in the via-hole or trench. Thus, residual tensile stress in the wiring layer or via-contact can be relaxed, ensuring prevention of generation of voids in the wiring layer or via-contact.

Before describing embodiments in accordance with the present invention, a mechanism for residual tensile stress to remain in a wiring layer or a via-contact is explained hereinbelow with reference to FIG. 4.

FIG. 4 shows a hysteresis curve showing a relation between a stress and a temperature in a flat copper film. In FIG. 4, an axis of abscissa indicates a temperature expressed in a degree of centigrade, and an axis of ordinates indicates a stress expressed in MPa. A positive stress in the axis of ordinates means a tensile stress, and a negative stress means a compressive stress.

In a conventional method of fabricating a semiconductor device, a tensile stress remains in a copper wiring layer due to plastic deformation of copper, if the copper wiring layer is annealed at 420 degrees centigrade, and then, cooled down to a room temperature. Even if a temperature cycle is added to the copper wiring layer, an obtained hysteresis curve makes the same hysteresis curve as illustrated in FIG. 4 after the added temperature cycle has finished, and a residual tensile stress at a room temperature remains unchanged. Hence, for simplification of explanation, there is explained how a stress varies in an annealing step after addition of a temperature cycle to the copper wiring layer.

As illustrated in FIG. 4, a residual tensile stress of about 310 MPa remains in a copper film at a point A at which a temperature is equal to a room temperature. If the copper film is heated from the point A along a broken line X1, a compressive stress is generated due to thermal expansion of copper until 200 degrees centigrade, resulting in that the residual tensile stress is significantly decreased.

If the copper film is further heated, the tensile stress is relaxed due to plastic deformation of copper caused by diffusion of copper at 200 degrees centigrade or higher, and hence, an absolute value of the tensile stress is reduced.

The copper film starts being cooled at a point B. As a result, a tensile stress starts being generated due to thermal contraction along a solid line X2. At a room temperature indicated as the point A, the tensile stress is returned to its original state.

As mentioned above, a high residual tensile stress unavoidably remains in a copper film fabricated in accordance with a damascene process, due to a temperature cycle.

In order to reduce the residual tensile stress, a copper film is annealed at a relatively low temperature, and subsequent steps are carried out at a relatively low temperature in a conventional method of fabricating a semiconductor device. However, as mentioned earlier, if copper is annealed at a relatively low temperature, the copper would have a smaller diameter, resulting in that a resistance to electromigration is reduced. That is, if annealing is carried out at a low temperature, advantages obtained by annealing are significantly reduced.

For instance, the report "Evolution of grain and microvoid structure in electroplated copper interconnection lines", Anthony Hobbs et al, Technical Report of IEICE, SDM2000-190 (2001-01), pp. 23, reports the experiment as follows. First, the number of copper grains having a diameter equal to or greater than 0.2 micrometers and the number of copper grains having a diameter smaller than 0.2 micrometers are counted. Then, a ratio of the first number to the second number is calculated. Then, the copper grains are all annealed both at 200 degrees centigrade or higher and at a temperature lower than 200 degrees centigrade. The results are as follows. If the copper grains are annealed at 200 degrees centigrade or higher, a diameter of the copper grains grows larger, and then, is saturated. In contrast, if the copper grains are annealed at a temperature lower than 200 degrees centigrade, the copper grains do not grow well, and a diameter of the copper grains is reduced.

In view of the results of the experiment, the inventor reached the conclusion that it is not necessary to define an upper limitation in an annealing temperature, and a residual tensile stress at a room temperature can be relaxed by cooling a copper wiring layer down to a temperature equal to or smaller than a predetermined temperature such as a room temperature after the copper wiring layer has been annealed. In other words, a residual tensile stress at a room temperature can be relaxed by virtue of a difference between stress variation found when copper is heated and stress variation found when copper is cooled.

Hereinbelow is explained the inventor's discovery with reference to FIGS. 4 and 5A to 5C.

FIGS. 5A to 5C are cross-sectional views of a semiconductor device, each illustrating status of a tensile stress observed when the method in accordance with the present invention is carried out after an upper wiring layer has been formed in accordance with a conventional dual damascene process. In FIGS. 5A to 5C, arrows indicate a residual tensile stress. A thicker or longer arrow indicates a higher residual tensile stress.

As illustrated in FIG. 5A, a residual tensile stress of about 310 MPa remains in the lower wiring layer 5, the upper wiring layer 13 and the via-contact 9 when a conventional damascene process has been finished. This state is expressed as the point A in FIG. 4. If the semiconductor device is compulsorily cooled down to about −75 degrees centigrade, the residual tensile stress is slightly increased due to plastic deformation of copper, as illustrated in FIG. 5B. This state is expressed as the point C in FIG. 4. If the semiconductor device stops being cooled at the point C, a compressive stress caused by elastic deformation of copper is significantly increased, resulting in that the residual tensile stress is canceled by the compressive stress. The residual tensile stress is reduced down to about 140 MPa at a room temperature, as illustrated in FIG. 5C. This state is expressed as the point D in FIG. 4.

As mentioned above, it would be possible to remarkably reduce a residual tensile stress at a room temperature by virtue of a difference between a degree to which a tensile stress increases due to plastic deformation of copper in a step of cooling copper, and a degree to which a compressive stress increases due to elastic deformation of copper in a step of returning copper back to a room temperature.

Though annealing is usually carried out in a process of fabricating a semiconductor device, a step of compulsorily cooling a semiconductor device down to a temperature smaller than a predetermined temperature such as a room temperature is never carried out. In addition, though it is expected that a residual stress may be varied if a temperature cycle is applied to a thin copper film, it is not possible to apply such a temperature cycle to a process of fabricating a semiconductor device, because a wiring layer is formed in various shapes and/or structures, and an annealing temperature is determined taking influence exerted on other parts and applicability to a process into consideration, in an actual process of fabricating a semiconductor device.

In view of the above-mentioned matters, the inventor determined when a step of cooling copper was carried out and a temperature at which copper was cooled. Thus, the present invention can be applied to a damascene process. The advantages that a residual tensile stress can be relaxed in a wiring layer by carrying out a step of cooling a wiring layer can be obtained by the inventor's discovery.

The advantages obtained by the aforementioned present invention will be described hereinbelow.

The first advantage is that it is possible to reduce defects caused by a residual tensile stress generated in copper and defects caused by stress migration, ensuring enhancement in a fabrication yield and reliability of a semiconductor device.

The reason is as follows. In the present invention, the step of cooling a semiconductor device down to a temperature lower than a predetermined temperature such as a room temperature is carried out after a step of annealing a semiconductor device or a step of fabricating a multi-layered wiring structure has been carried out. As a result, copper of which a wiring layer is composed is plastically deformed, and is cooled containing therein a tensile stress generated at a room temperature. While the copper is returned back to a room temperature, the copper elastically deforms. As a result, it would be possible to significantly reduce a residual tensile stress at a room temperature. Thus, it is possible to relax a residual tensile stress remaining in a copper wiring layer, ensuring it is possible to prevent a copper wiring layer from being broken during carrying out CMP, and further prevent defects caused by stress migration.

The second advantage is that it is possible to prevent reduction in a resistance to electromigration.

This is because it is not necessary to anneal a semiconductor device at a relatively low temperature, since a residual tensile stress generated due to the annealing can be relaxed in the cooling step to be carried out after the annealing.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

A method of fabricating a semiconductor device in accordance with the first embodiment is explained hereinbelow with reference to FIGS. 6A to 6K and 7. FIGS. 6A to 6K are cross-sectional views of a semiconductor device, illustrating respective steps of the method in accordance with the first embodiment of the present invention, and FIG. 7 is a graph showing a relation between a cumulative failure rate and a failure time in a semiconductor device fabricated in accordance with the first embodiment.

In the first embodiment, the method in accordance with the present invention is applied to a single damascene process.

Figure 6A:
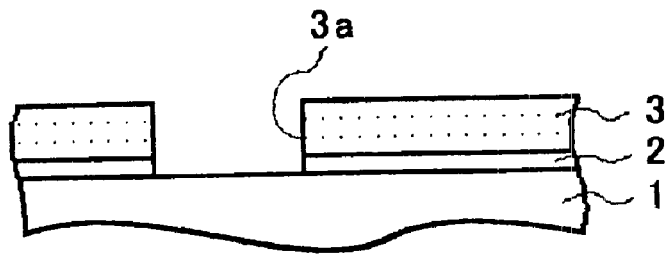
FIGS. 6A to 6K are cross-sectional views of a semiconductor device, illustrating respective steps of a single damascene process in accordance with the first embodiment of the present invention.
Figure 7:
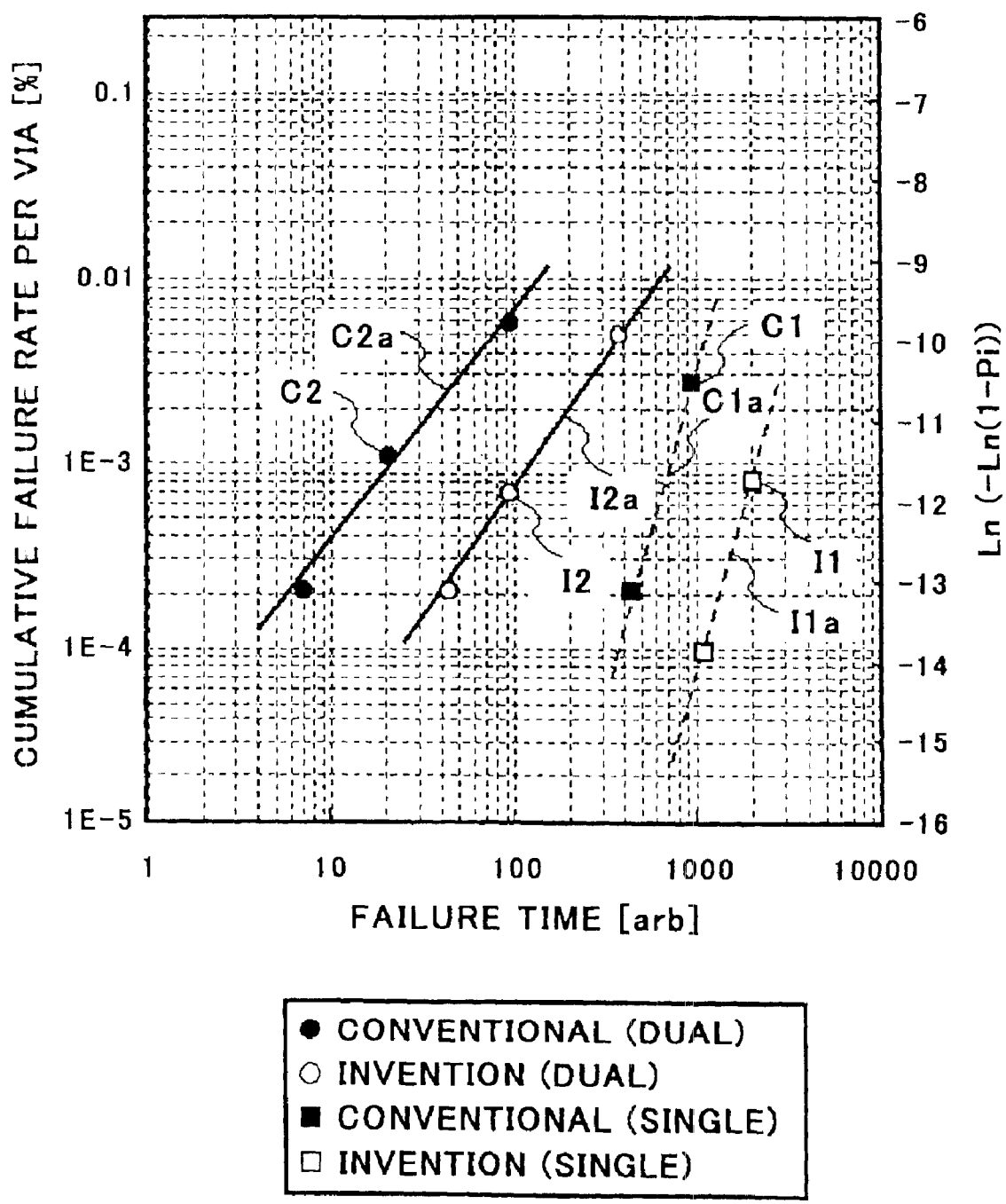
FIG. 7 is a graph showing a relation between a cumulative failure rate and a failure time in a semiconductor device fabricated in accordance with the first embodiment of the present invention.

First, as illustrated in FIG. 6A, a first etching stopper layer 2 is formed on a substrate 1 on which a device such as a MOS transistor has been already fabricated, by chemical vapor deposition (CVD) or plasma-enhanced chemical vapor deposition.

Then, a first interlayer insulating film 3 is formed entirely over the first etching stopper film 2.

Then, an anti-reflection film and chemically amplified resist are coated on the first interlayer insulating film 3, and then, patterned by KrF photolithography into a resist pattern (not illustrated).

Then, the first interlayer insulating film 3 and the first etching stopper layer 2 are dry-etched with the resist pattern being used as a mask, to thereby form a first wiring trench 3a throughout the first interlay insulating film 3.

Then, oxygen plasma ashing and wet treatment using organic remover are applied to the resist pattern and the anti-reflection film to thereby remove them.

Materials of which the first etching stopper film 2 and the first interlayer insulating film 3 are not to be limited to any particular materials. If an appropriate selection ratio in etching can be obtained, any combination of materials may be selected. For instance, $SiO_2$, SiN, SiON, SiC or a film having a low dielectric constant may be selected.

Figure 6B:
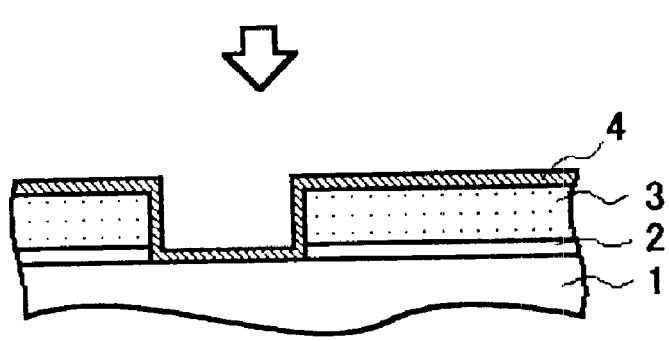

Then, as illustrated in FIG. 6B, a barrier metal film 4 is formed by sputtering entirely over the first interlayer insulating film 3 and an exposed area of the substrate 1. The barrier metal film 4 may be comprised of a single-layered film composed of Ti, TiN, Ta, TaN or WN, or a multi-layered film including films composed of a combination of Ti, TiN, Ta, TaN and WN.

Then, a seed metal film (not illustrated) is formed on the barrier metal film 4 by sputtering for facilitating growth of electroplated copper.

Figure 6C:
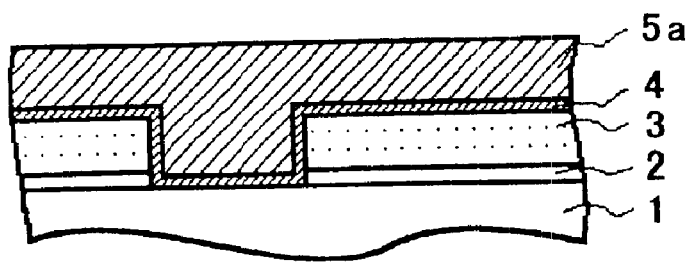

Then, copper 5a which will make a lower wiring layer is deposited over the barrier metal film 4 by electrolytic plating such that the first wiring trench 3a is filled with the copper 5a, as illustrated in FIG. 6C.

Then, the resultant illustrated in FIG. 6C is annealed at a temperature in the range of about 200 to 400 degrees centigrade to improve crystallinity of the copper 5a. Since a step of cooling the copper 5a is carried out later in the method for relaxing a residual tensile stress, the resultant illustrated in FIG. 6C is annealed at a relatively high temperature unlike a conventional method.

Figure 4:
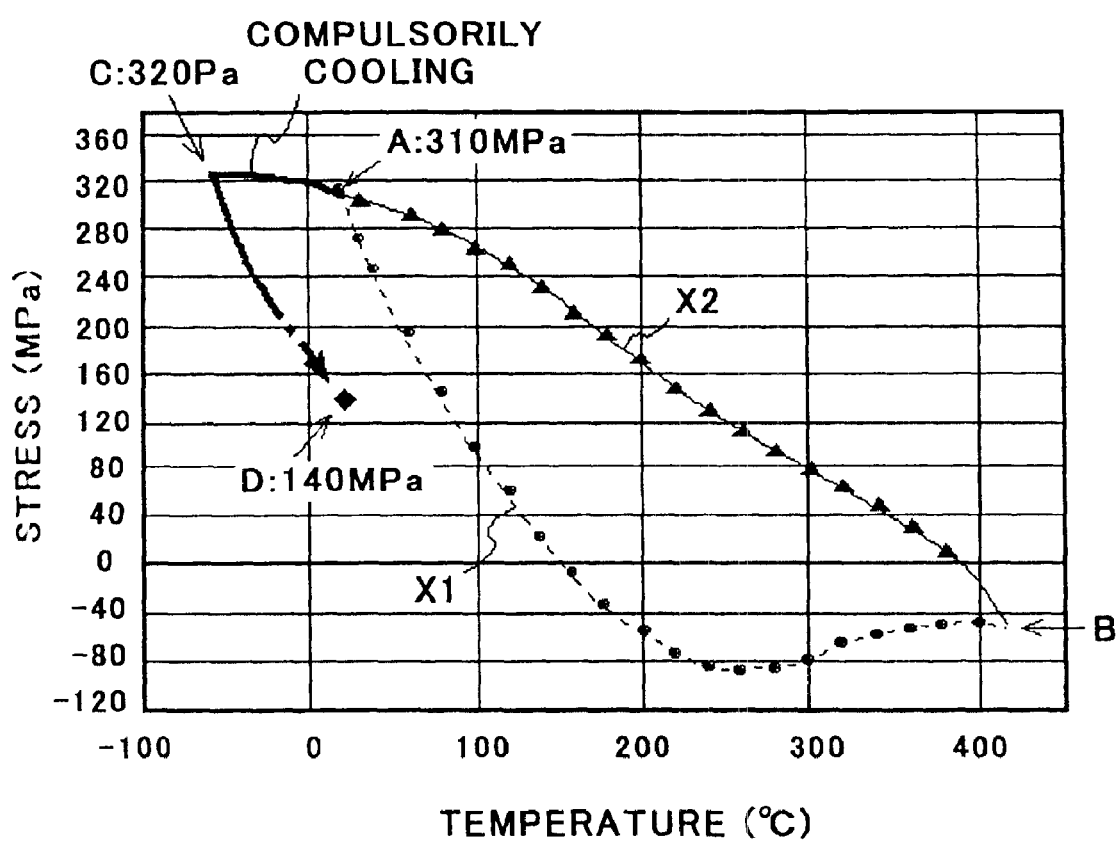
FIG. 4 shows a hysteresis curve showing a relation between a stress and a temperature in a semiconductor device in accordance with the present invention.
Figure 5A:
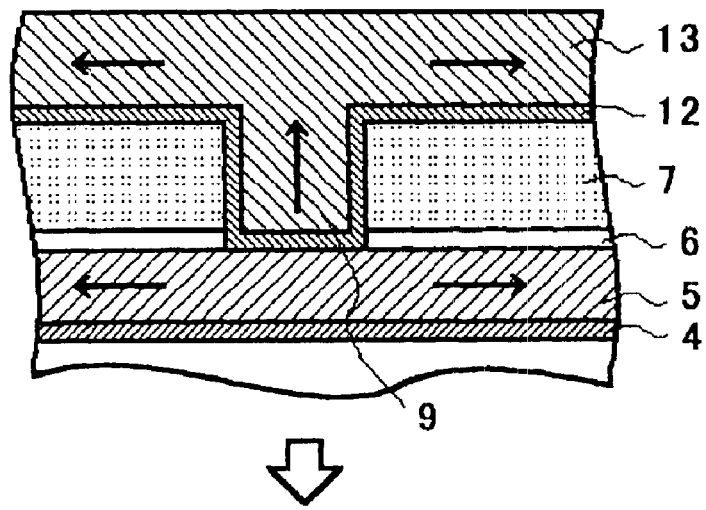
FIGS. 5A to 5C are cross-sectional views of a semiconductor device in accordance with the present invention, showing advantages provided by the semiconductor device.
Figure 5B:
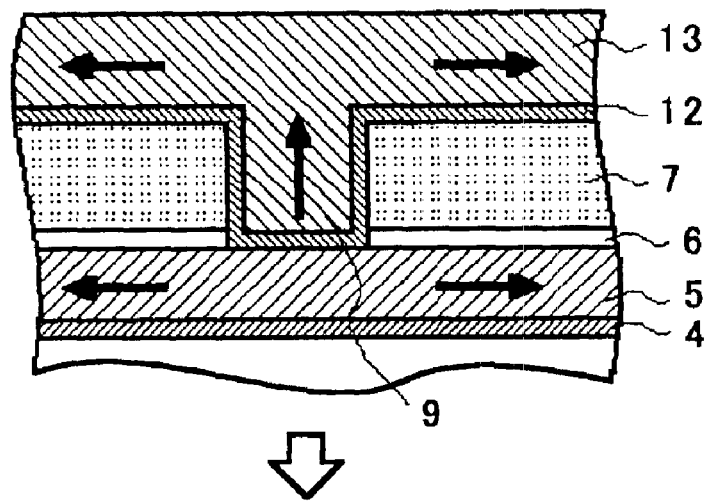
Figure 5C:
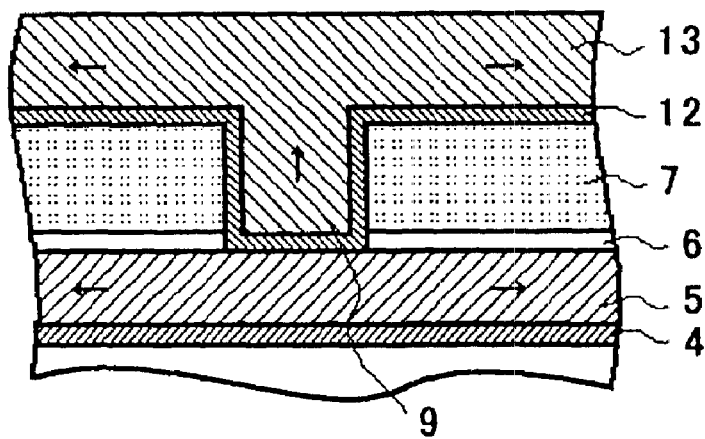

Then, a step of cooling the copper 5a is carried out. As mentioned earlier, a stress remains at a room temperature in a plastically deformable material such as metal, as illustrated in FIG. 4, if a temperature cycle is applied to the material. However, such a residual stress can be reduced by cooling the material down to a temperature lower than a room temperature. As the material is cooled down to a lower temperature, a residual stress is relaxed to a greater degree. However, if the material is cooled down to a lower temperature, it would take longer time, much power and much cost to carry out a cooling step.

Hence, the inventor had conducted the experiment in which the material was cooled down to various temperatures.

The results of the experiment show that if the material is cooled down to −75 degrees centigrade or lower, it would be possible to relax a residual tensile stress to such a degree that it is possible to prevent disconnection caused by voids. Accordingly, it is preferable that the copper 5a is cooled down to −75 degrees centigrade or lower after the copper 5a has been annealed.

The copper 5a may be cooled down in an annealing apparatus equipped with a cooler, in which case, the copper 5a is annealed and then cooled down in a common apparatus. As an alternative, after the copper 5a has been annealed, the copper 5a may be cooled in a separate apparatus having an ability of cooling an object in vacuum or in inert gas atmosphere. Since plastic deformation occurs earlier than creep deformation in the cooling step, it is not necessary to strictly define a cooling rate and a cooling time.

Figure 6D:
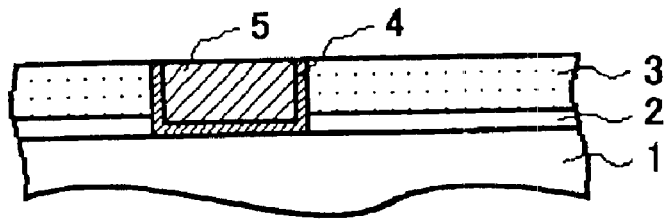

Then, as illustrated in FIG. 6D, the copper 5a and the barrier metal 4 are polished by chemical mechanical polishing (CMP) until the first interlayer insulating film 3 appears. Thus, there is formed a lower wiring layer 5 comprised of the copper 5a filling the first wiring trench 3a therewith.

Figure 6E:
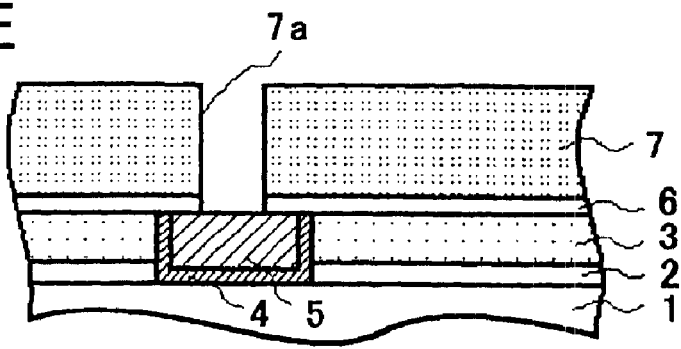

Then, as illustrated in FIG. 6E, a first cap film 6 and a via interlayer insulating film 7 are formed on the first interlayer insulating film 3 by CVD or plasma-enhanced CVD.

Then, an anti-reflection film and chemically amplified resist are coated on the via interlayer insulating film 7, and then, patterned by KrF photolithography into a resist pattern (not illustrated).

Then, the via interlayer insulating film 7 and the first cap film 6 are dry-etched with the resist pattern being used as a mask, to thereby form a via-hole 7a throughout the via interlayer insulating film 7 and the first cap film 6.

Then, oxygen plasma ashing and wet treatment using organic remover are applied to the resist pattern and the anti-reflection film to thereby remove them.

Materials of which the first cap film 6 and he via interlayer insulating film 7 are not to be limited to any particular materials. If an appropriate selection ratio in etching can be obtained, any combination of materials may be selected. For instance, $SiO_2$, SiN, SiON, SiC or a film having a low dielectric constant may be selected.

Figure 6F:
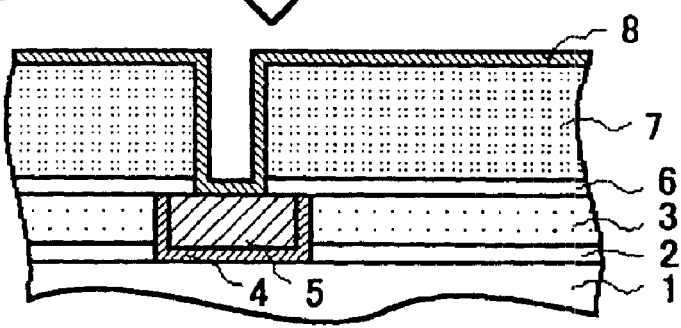

Then, as illustrated in FIG. 6F, a barrier metal film 8 is formed by sputtering entirely over the via interlayer insulating film 7 and an exposed area of the lower wiring layer 5. The barrier metal film 8 may be comprised of a single-layered film composed of Ti, TiN, Ta, TaN or WN, or a multi-layered film including films composed of a combination of Ti, TiN, Ta, TaN and WN.

Then, a seed metal film (not illustrated) is formed on the barrier metal film 8 by sputtering.

Figure 6G:
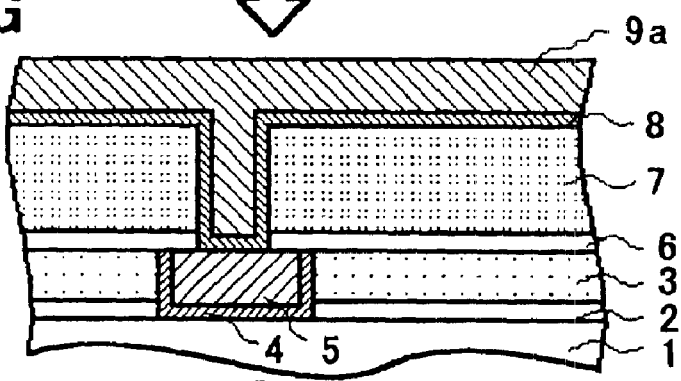

Then, copper 9a which will make an upper wiring layer is deposited over the barrier metal film 8 by electrolytic plating such that the via-hole 7a is filled with the copper 9a, as illustrated in FIG. 6G.

Then, the resultant illustrated in FIG. 6G is annealed at a temperature in the range of about 200 to 400 degrees centigrade to improve crystallinity of the electroplated copper 9a.

Then, the resultant illustrated in FIG. 6G is cooled down to −75 degrees centigrade or lower to relax the residual tensile stress generated in the copper 9a by the annealing.

Figure 6H:
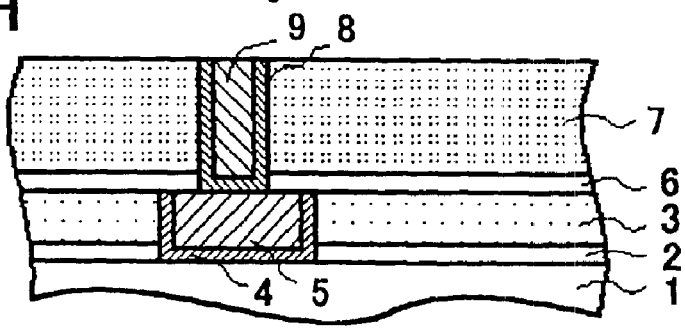

Then, as illustrated in FIG. 6H, the copper 9a and the barrier metal film 8 are polished by chemical mechanical polishing (CMP) until the via interlayer insulating film 7 appears. Thus, there is formed a via-contact 9 comprised of the copper 9a filling the via-hole 7a therein and making electrical contact with the lower wiring layer 5.

Figure 6I:
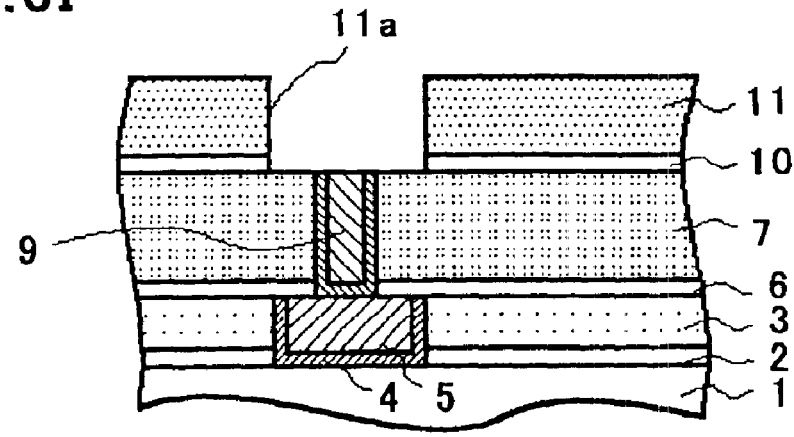
Figure 6I:

Then, as illustrated in FIG. 6I, a second etching stopper film 10 and a second interlayer insulating film 11 are formed on the resultant illustrated in FIG. 6H.

Then, a resist film (not illustrated) is formed again on the second interlayer insulating film 11, and then, is patterned.

Then, the second interlayer insulating film 11 is etched with the patterned resist film being used as a mask, to thereby form a second wiring trench 11a throughout the second interlayer insulating film 11.

Then, the second etching stopper film 10 is removed in its exposed areas.

Figure 6J:
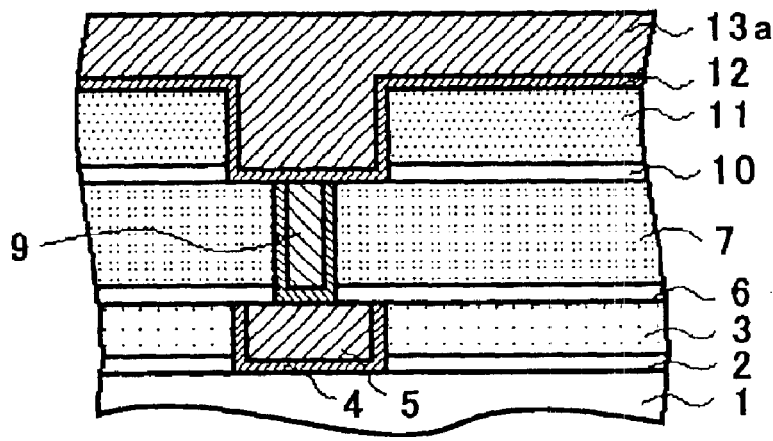
Figure 6J:
Figure 6J:

Then, as illustrated in FIG. 6J, a barrier metal film 12 is formed by sputtering entirely over the resultant illustrated in FIG. 6I.

Then, a seed metal film (not illustrated) is formed on the barrier metal film 12 by sputtering for facilitating growth of electroplated copper.

Then, copper 13a which will make an upper wiring layer is deposited over the barrier metal film 12 by electrolytic plating such that the second wiring trench 11a is filled with the copper 13a, as illustrated in FIG. 6J.

Then, the resultant illustrated in FIG. 6J is annealed at a temperature in the range of about 200 to 400 degrees centigrade to improve crystallinity of the electroplated copper 13a.

Then, the resultant illustrated in FIG. 6J is cooled down to −75 degrees centigrade or lower to relax the residual tensile stress generated in the copper 13a by the annealing.

Figure 6K:
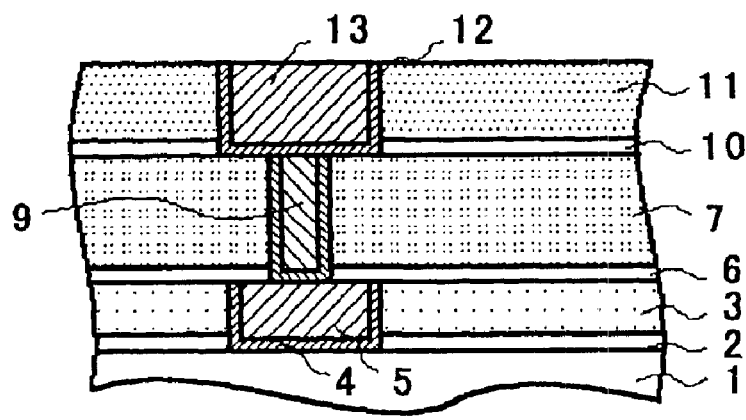

Then, as illustrated in FIG. 6K, the copper 13a is polished by chemical mechanical polishing (CMP) until the second interlayer insulating film 11 appears, to thereby form an upper wiring layer 13 in the second wiring trench 11a.

Thereafter, the steps having been explained with reference to FIGS. 6I to 6K are repeatedly carried out to thereby fabricate a semiconductor device having a desired multi-layered structure.

With respect to the thus fabricated semiconductor device, there were measured a cumulative failure rate and a failure time. The results of the measurement are shown in FIG. 7.

In FIG. 7, hollow squares I1 and a broken line I1a show a semiconductor device fabricated in accordance with the first embodiment, and solid squares C1 and a broken line C1a show a semiconductor device fabricated in accordance with a conventional method.

As is understood in view of FIG. 7, a failure rate of the semiconductor device fabricated in accordance with the first embodiment is lower by about one figure than a failure rate of the semiconductor device fabricated in accordance with a conventional method. This means that it is proved that the step of cooling the copper 5a, 9a and 13a down to −75 degrees centigrade or lower immediately after carrying out the annealing step relaxes the residual tensile stress generated in the copper 5a, 9a and 13a by the annealing.

As mentioned above, the method in accordance with the first embodiment makes it possible to relax a residual tensile stress generated in copper by annealing, by cooling the copper after carrying out annealing. Thus, it is possible to avoid disconnection between upper and lower wiring layers due to voids generated in a via-contact, a lower wiring layer or an upper wiring layer which voids are caused by a residual tensile stress, and further avoid reduction in a resistance to electromigration which reduction is caused by annealing a semiconductor device at a relatively low temperature.

Though the lower wiring layer 5, the via-contact 9 and the upper wiring layer 13 are all composed of copper in the above-mentioned first embodiment, they may be composed of other metals such as tungsten (W). As an alternative, at least one of the lower wiring layer 5, the via-contact 9 and the upper wiring layer 13 may be composed of metal other than copper. For instance, the lower wiring layer 5 may be composed of aluminum or aluminum/copper alloy.

[Second Embodiment]

A method of fabricating a semiconductor device in accordance with the second embodiment is explained hereinbelow with reference to FIGS. 8A to 8I. FIGS. 8A to 8I are cross-sectional views of a semiconductor device, illustrating respective steps of the method in accordance with the second embodiment of the present invention.

In the second embodiment, the method in accordance with the present invention is applied to a dual damascene process.

First, as illustrated in FIGS. 8A to 8D, a lower wiring layer 5 is formed in a first wiring trench 3a formed throughout a first interlayer insulating film 3, by carrying out the steps having been explained with reference to FIGS. 6A to 6D.

Figure 1A:
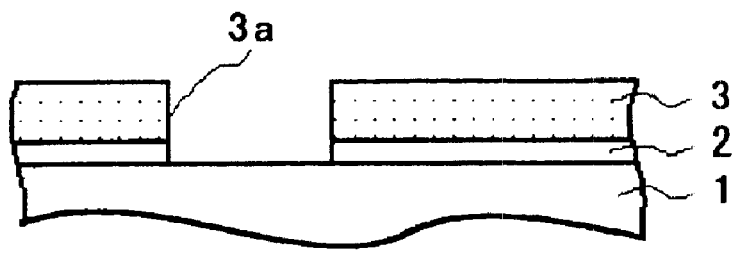
FIGS. 1A to 1F are cross-sectional views of a semiconductor device, illustrating respective steps of a conventional dual damascene process.
Figure 1B:
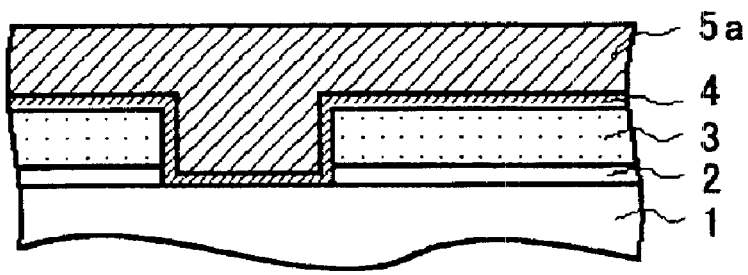
Figure 1C:
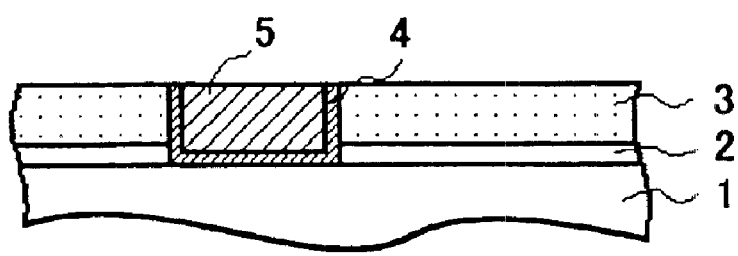
Figure 1D:
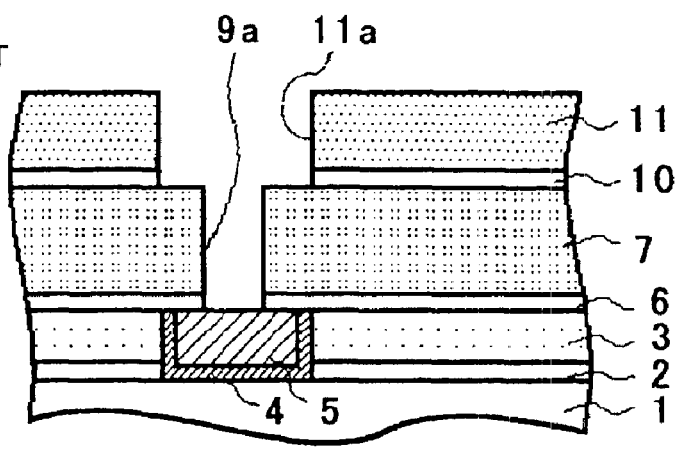
Figure 1E:
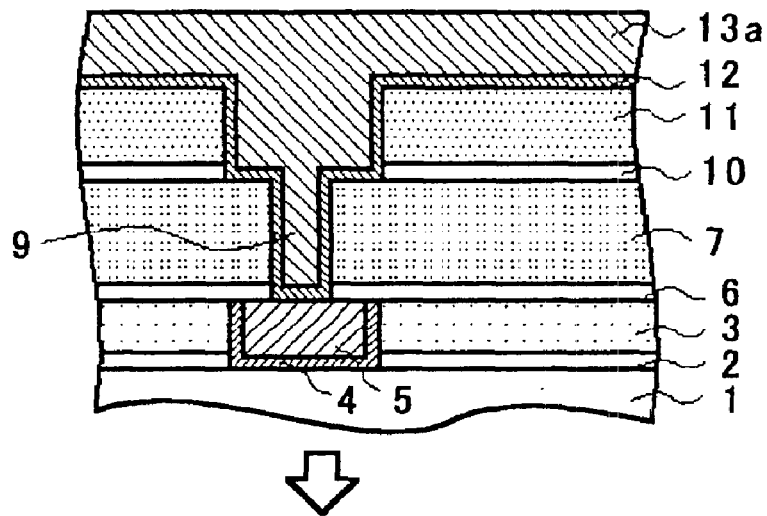
Figure 1F:
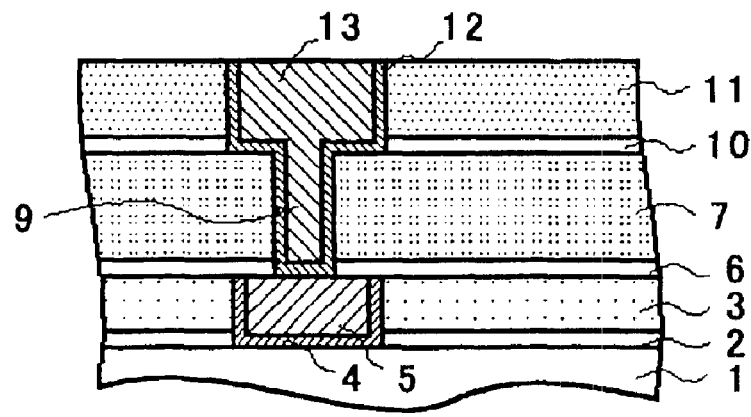
Figure 2:
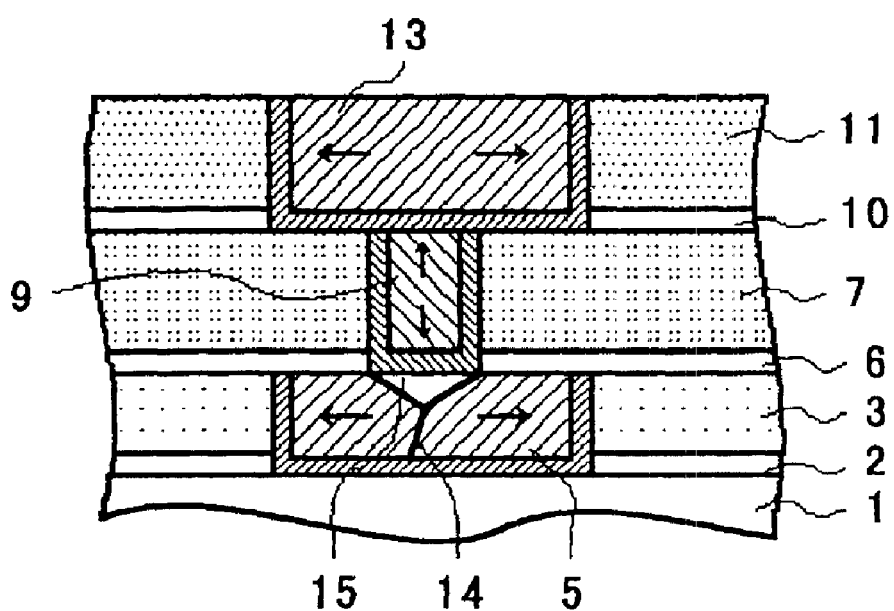
FIG. 2 is a cross-sectional view of a semiconductor device, illustrating a defect occurring in a conventional semiconductor device fabricated in accordance with a single damascene process.
Figure 3A:
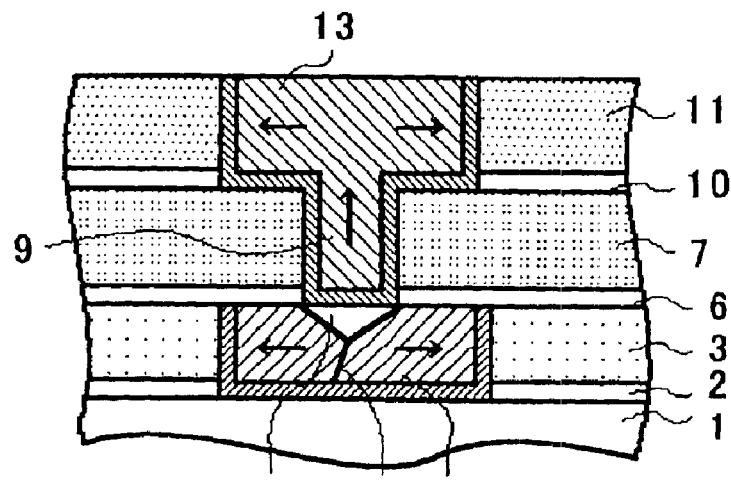
FIGS. 3A to 3C are cross-sectional views of a semiconductor device, each illustrating a defect occurring in a conventional semiconductor device fabricated in accordance with a dual damascene process.
Figure 3B:
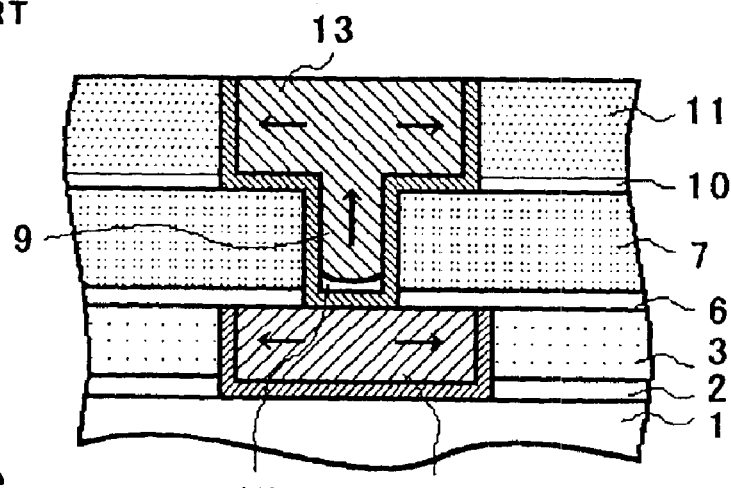
Figure 3C:
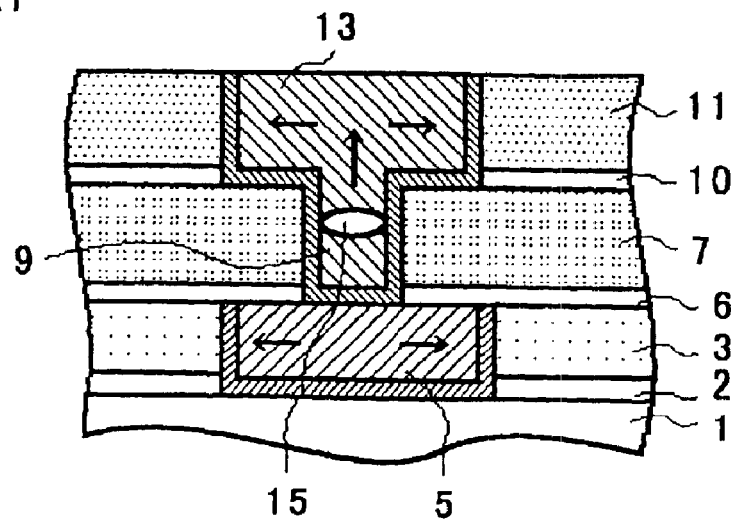
Figure 8A:
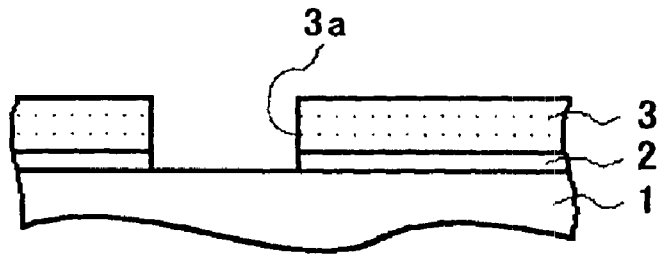
FIGS. 8A to 8I are cross-sectional views of a semiconductor device, illustrating respective steps of a dual damascene process in accordance with the second embodiment of the present invention.
Figure 8B:
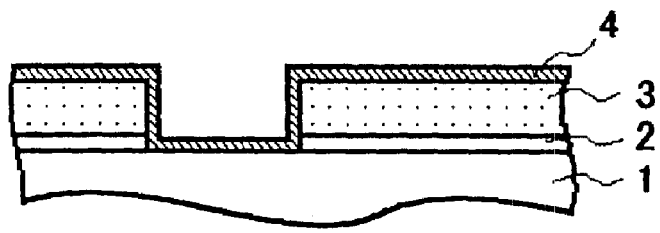
Figure 8C:
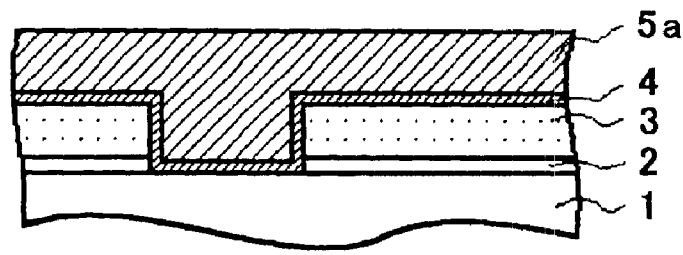
Figure 8D:
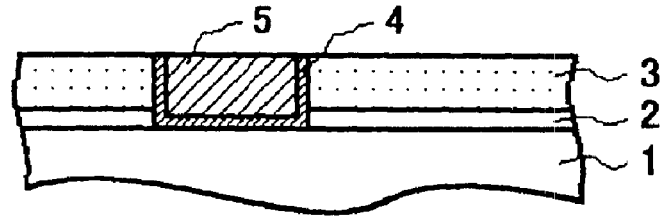
Figure 8E:
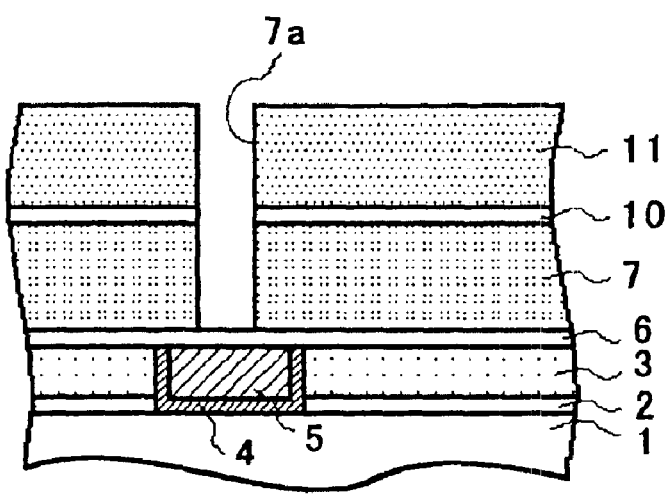

Then, as illustrated in FIG. 8E, a first cap film 6, a via interlayer insulating film 7, a second etching stopper film 10 acting as an etching stopper to a later mentioned second wiring trench 11a, and a second interlayer insulating film 11 are formed in this order on the resultant illustrated in FIG. 1C, by CVD or plasma-enhanced CVD.

Then, a resist film (not illustrated) is formed on the second interlayer insulating film 11, and then, is patterned.

Then, the second interlayer insulating film 11, the second etching stopper film 10 and the via interlayer insulating film 7 are dry-etched with the patterned resist film being used as a mask, to thereby form a via-hole 7a throughout them.

Materials of which the first cap film 6, the via interlayer insulating film 7, the second etching stopper film 10 and the second interlayer insulating film 11 are not to be limited to any particular materials. If an appropriate selection ratio in etching can be obtained, any combination of materials may be selected. For instance, $SiO_2$, SiN, SiON, SiC or a film having a low dielectric constant may be selected.

Then, a resist film (not illustrated) is formed again on the second interlayer insulating film 11, and then, is patterned.

Then, the second interlayer insulating film 11 is dry-etched with the patterned resist film being used as a mask, to thereby form a second wiring trench 11a throughout the second interlayer insulating film 11. In etching the second interlayer insulating film 11, the second etching stopper film 10 acts as an etching stopper, and hence, the second interlayer insulating film 11 is removed by etching throughout its entire thickness.

Then, the second etching stopper film 10 and the first cap film 6 are removed in their exposed areas.

Figure 8F:
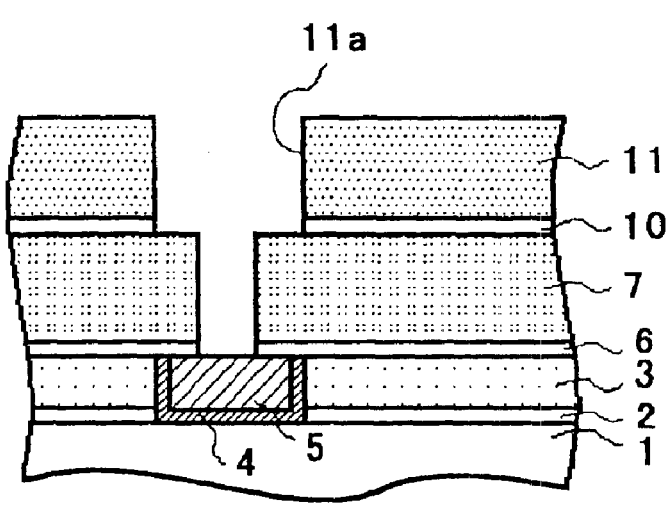
Figure 8G:
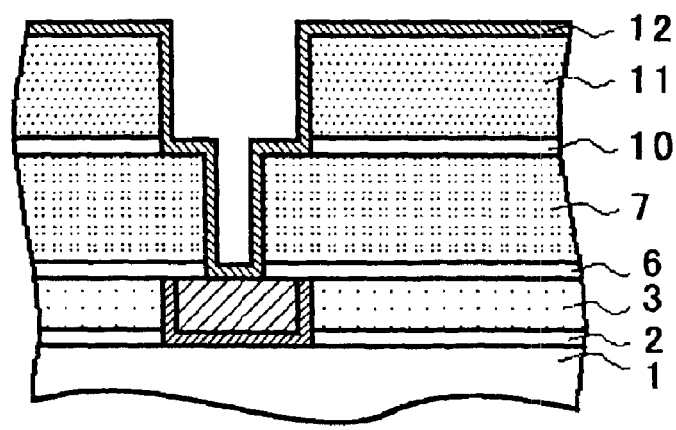

Then, as illustrated in FIG. 8G, a barrier metal film 12 is formed by sputtering entirely over the resultant illustrated in FIG. 8F. The barrier metal film 12 may be comprised of a single-layered film composed of Ti, TiN, Ta, TaN or WN, or a multi-layered film including films composed of a combination of Ti, TiN, Ta, TaN and WN.

Then, a seed metal film (not illustrated) is formed on the barrier metal film 12 by sputtering for facilitating growth of electroplated copper.

Figure 8H:
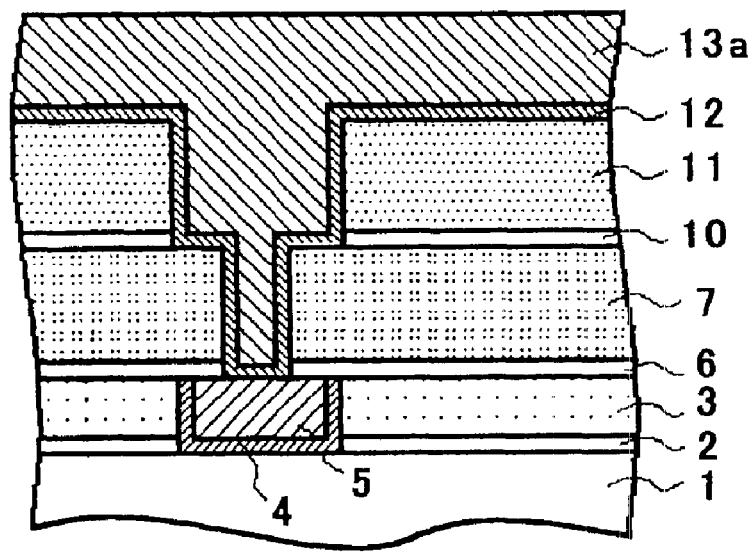

Then, copper 13a which will make an upper wiring layer is deposited over the barrier metal film 12 by electrolytic plating such that the via-hole 7a and the second wiring trench 11a are filled with the copper 13a, as illustrated in FIG. 8H.

Then, the resultant illustrated in FIG. 8H is annealed at a temperature in the range of about 200 to 400 degrees centigrade to improve crystallinity of the electroplated copper 13a.

Then, the resultant illustrated in FIG. 8H is cooled down to −75 degrees centigrade or lower to relax the residual tensile stress generated in the copper 13a by the annealing.

Figure 8I:
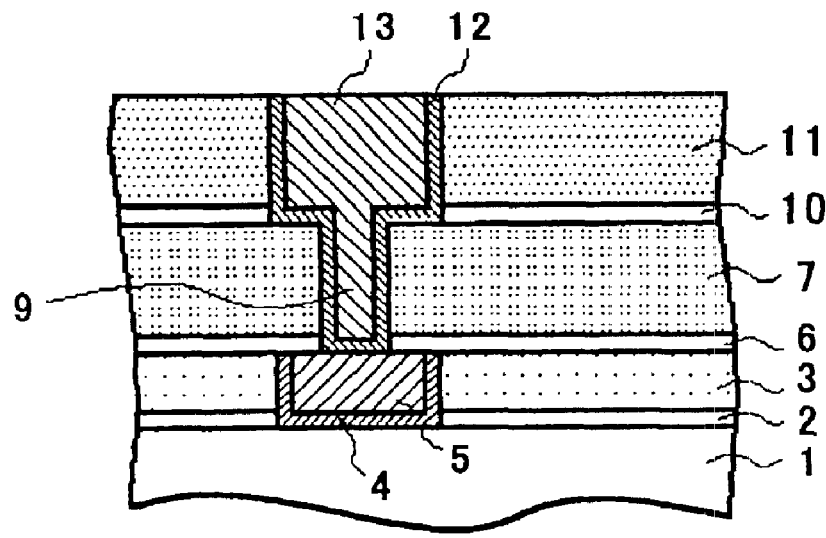

Then, as illustrated in FIG. 8I, the copper 13a and the barrier metal film 12 are polished by chemical mechanical polishing (CMP) until the second interlayer insulating film 11 appears. Thus, there are simultaneously formed an upper wiring layer 13 comprised of the copper 13a filling the second wiring trench 11a therewith, and a via-contact 9 comprised of the copper 13a filling the via-hole 7a therewith.

Thereafter, the steps having been explained with reference to FIGS. 8E to 8I are repeatedly carried out to thereby fabricate a semiconductor device having a desired multi-layered structure.

With respect to the thus fabricated semiconductor device, there were measured a cumulative failure rate and a failure time, similarly to the first embodiment. The results of the measurement are shown in FIG. 7.

In FIG. 7, hollow circles I2 and a solid line I2a show a semiconductor device fabricated in accordance with the second embodiment, and solid circles C2 and a solid line C2a show a semiconductor device fabricated in accordance with a conventional method.

As is understood in view of FIG. 7, a failure rate of the semiconductor device fabricated in accordance with the second embodiment is lower by about one figure than a failure rate of the semiconductor device fabricated in accordance with a conventional method. This means that it is proved that the step of cooling the copper 5a, 9a and 13a down to −75 degrees centigrade or lower immediately after carrying out the annealing step relaxes the residual tensile stress generated in the copper 5a, 9a and 13a by the annealing.

As mentioned above, the method in accordance with the second embodiment makes it possible to relax a residual tensile stress generated in copper by annealing, by cooling the copper after carrying out annealing. Thus, it is possible to avoid disconnection between upper and lower wiring layers due to voids generated in a via-contact, a lower wiring layer or an upper wiring layer which voids are caused by a residual tensile stress, and further avoid reduction in a resistance to electromigration which reduction is caused by annealing a semiconductor device at a relatively low temperature.

Though the present invention is applied to a via-first dual damascene process which is one of dual damascene processes, in the second embodiment, the present invention may be applied to a dual hard mask process in which a hard mask is formed on the second interlayer insulating film 11 for forming a wiring trench, and further to other dual damascene processes.

[Third Embodiment]

A method of fabricating a semiconductor device in accordance with the third embodiment is explained hereinbelow with reference to FIGS. 9A to 9I and 10. FIGS. 9A to 9I are cross-sectional views of a semiconductor device, illustrating respective steps of the method in accordance with the third embodiment of the present invention.

In the above-mentioned first and second embodiments, the step of cooling copper is carried out after having carried out the annealing step. However, if a semiconductor device is designed to have a multi-layered structure, it is unavoidable that the cooling step has to be repeatedly carried out, resulting in an increase in the number of fabrication steps. Accordingly, the cooling step is carried out only once after the formation of a multi-layered structure in the third embodiment to thereby prevent an increase in the number of fabrication steps. For instance, the cooling step is carried out after a step of forming pads, a step of polishing a wafer, a step of dicing a wafer, a step of packaging a semiconductor chip, or a step of forming bonding wires.

Figure 9A:
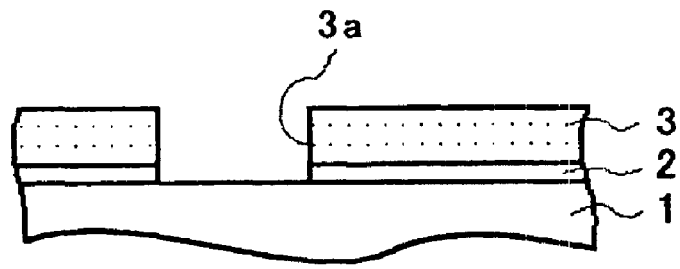
FIGS. 9A to 9I are cross-sectional views of a semiconductor device, illustrating respective steps of a dual damascene process in accordance with the third embodiment of the present invention.
Figure 9B:
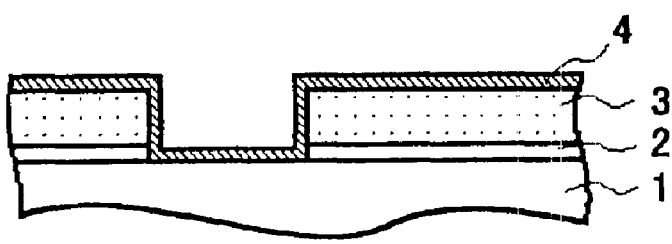
Figure 9C:
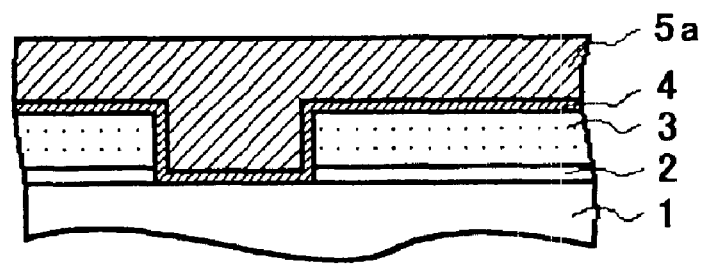

First, as illustrated in FIGS. 9A to 9C, copper 5a is deposited over a barrier metal film 4 by electrolytic plating such that a first wiring trench 3a is filled with the copper 5a, by carrying out the steps having been explained with reference to FIGS. 6A to 6C in the first embodiment.

Then, the resultant illustrated in FIG. 9C is annealed at a temperature in the range of about 200 to 400 degrees centigrade to improve crystallinity of the copper 5a.

Though the step of cooling the resultant illustrated in FIG. 9C down to −75 degrees centigrade or lower is carried out subsequently to the annealing step in the first and second embodiments, the cooling step is not carried out at this stage in the third embodiment, because the cooling step is carried out after a multi-layered structure has been fabricated.

Figure 9D:
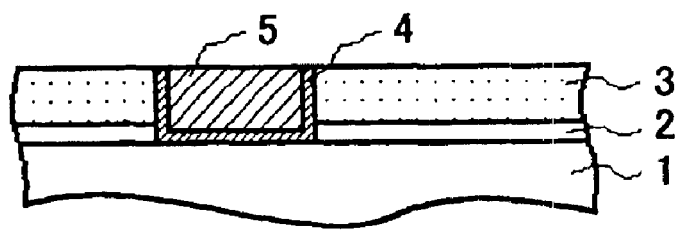

Then, as illustrated in FIG. 9D, the copper 5a and the barrier metal 4 are polished by chemical mechanical polishing (CMP) until the first interlayer insulating film 3 appears. Thus, there is formed a lower wiring layer 5 comprised of the copper 5a filling the first wiring trench 3a therewith.

Figure 9E:
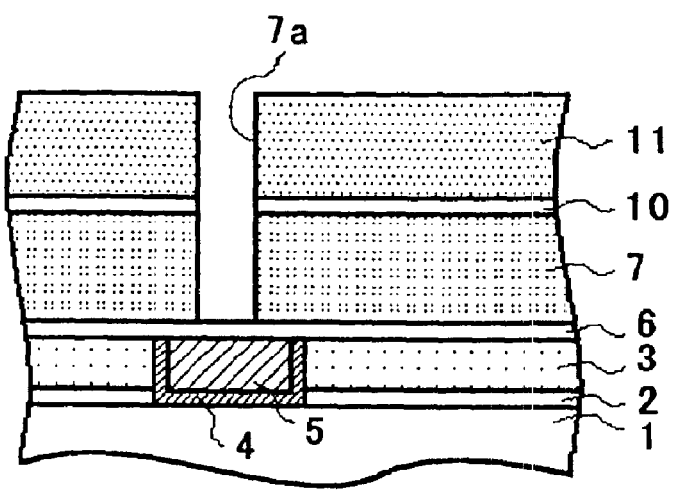
Figure 9E:

Then, as illustrated in FIG. 9E, a first cap film 6, a via interlayer insulating film 7, a second etching stopper film 10, and a second interlayer insulating film 11 are formed in this order on the resultant illustrated in FIG. 9D, by CVD or plasma-enhanced CVD.

Then, a resist film (not illustrated) is formed on the second interlayer insulating film 11, and then, is patterned.

Then, the second interlayer insulating film 11, the second etching stopper film 10 and the via interlayer insulating film 7 are dry-etched with the patterned resist film being used as a mask, to thereby form a via-hole 7a throughout them.

Then, a resist film (not illustrated) is formed again on the second interlayer insulating film 11, and then, is patterned.

Then, the second interlayer insulating film 11 is dry-etched with the patterned resist film being used as a mask, to thereby form a second wiring trench 11a throughout the second interlayer insulating film 11. In etching the second interlayer insulating film 11, the second etching stopper film 10 acts as an etching stopper, and hence, the second interlayer insulating film 11 is removed by etching throughout its entire thickness.

Then, the second etching stopper film 10 and the first cap film 6 are removed in their exposed areas.

Figure 9F:
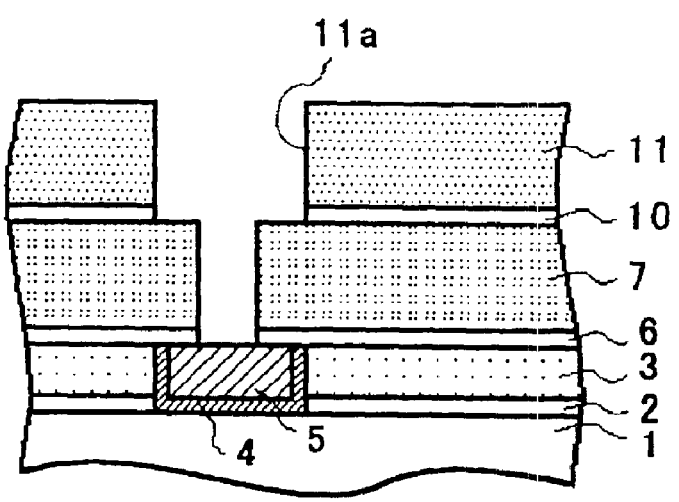
Figure 9F:
Figure 9G:
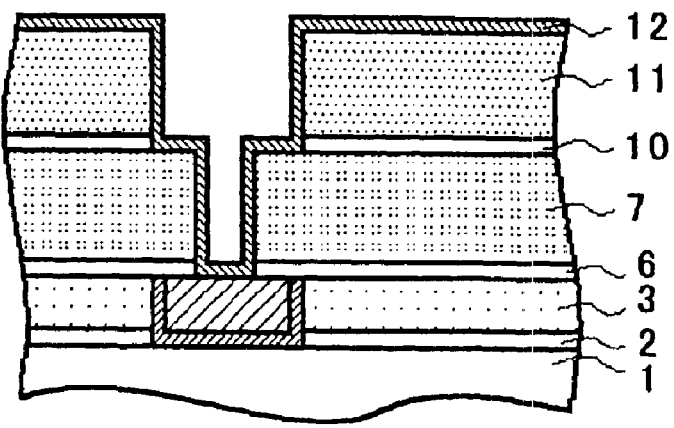

Then, as illustrated in FIG. 9G, a barrier metal film 12 is formed by sputtering entirely over the resultant illustrated in FIG. 9F.

Then, a seed metal film (not illustrated) is formed on the barrier metal film 12 by sputtering for facilitating growth of electroplated copper.

Figure 9H:
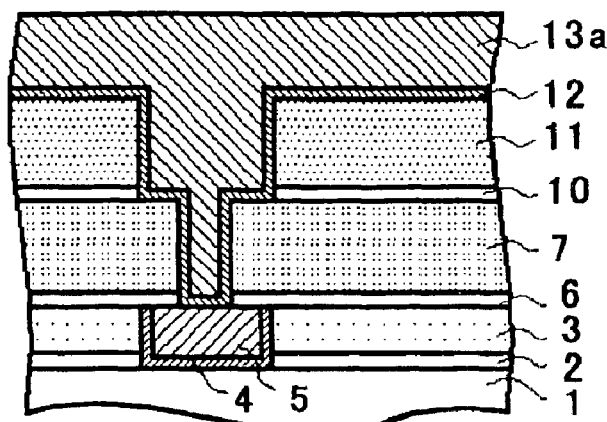

Then, copper 13a which will make an upper wiring layer is deposited over the barrier metal film 12 by electrolytic plating such that the via-hole 7a and the second wiring trench 11a are filled with the copper 13a, as illustrated in FIG. 9H.

Then, the resultant illustrated in FIG. 9H is annealed at a temperature in the range of about 200 to 400 degrees centigrade to improve crystallinity of the electroplated copper 13a.

Though the step of cooling the resultant illustrated in FIG. 9H down to −75 degrees centigrade or lower is carried out subsequently to the annealing step in the second embodiment, the cooling step is not carried out at this stage in the third embodiment, because the cooling step is carried out after a multi-layered structure has been fabricated.

Figure 9I:
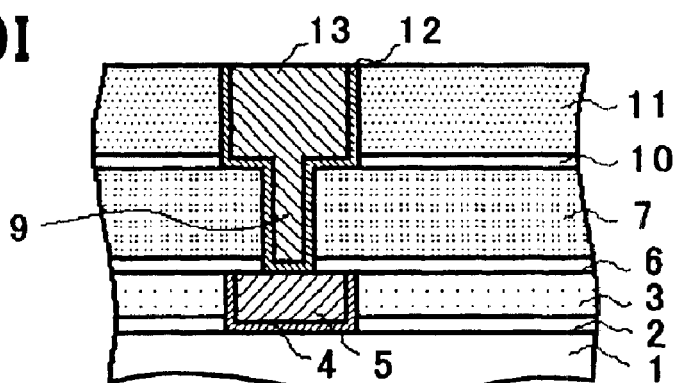

Then, as illustrated in FIG. 9I, the copper 13a and the barrier metal film 12 are polished by chemical mechanical polishing (CMP) until the second interlayer insulating film 11 appears. Thus, there are simultaneously formed an upper wiring layer 13 comprised of the copper 13a filling the second wiring trench 11a therewith, and a via-contact 9 comprised of the copper 13a filling the via-hole 7a therewith.

Thereafter, the steps having been explained with reference to FIGS. 9E to 9I are repeatedly carried out to thereby fabricate a semiconductor device having a desired multi-layered structure.

Thereafter, there are carried out steps of (A) forming electrode pads, (B) polishing a wafer into a desired thickness, (C) dicing a wafer into chips, and (D) mounting each of chips on a package and electrically connecting each of chips to the electrode pads through bonding wires, to thereby complete a semiconductor device.

In the third embodiment, the step of cooling the resultant illustrated in FIG. 9C and 9H down to −75 degrees centigrade or lower is carried out at least once subsequently to any one of the above-mentioned steps (A) to (D).

In the above-mentioned first and second embodiments, a residual tensile stress is of about 310 MPa, since the electroplated copper 5a and 13a are in the form of a flat film, that is, a film not patterned. In contrast, since the patterned copper is surrounded by the wiring layers and the via interlayer insulating film in the third embodiment, it is considered that a residual tensile stress remaining in the copper wiring layers and the via-contact and a relation between a stress and a temperature are different from those in the first and second embodiments. Accordingly, the inventor had conducted the experiment to measure a residual tensile stress remaining in a copper wiring layer by simulation under various factors such as a width, a thickness and a length of a copper wiring layer. The results are shown in FIG. 10.

Figure 10:
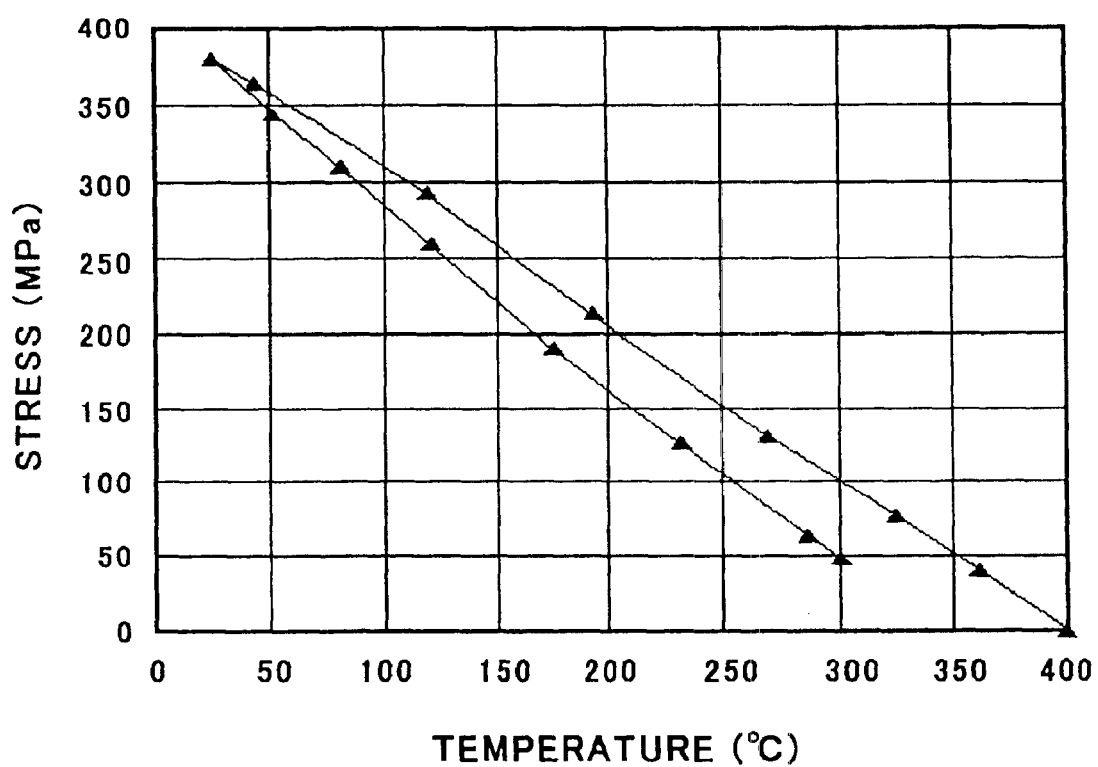
FIG. 10 shows a hysteresis curve indicating a relation between a stress and a temperature in a copper wiring layer in a semiconductor device in accordance with the present invention.

FIG. 10 shows a hysteresis curve indicating a relation between a stress and a temperature in a thickness-wise direction of a copper wiring layer.

In comparison with FIG. 4 in which the measurement was made to copper in the form of a flat film, that is, copper not patterned, it is understood in view of FIG. 10 that the patterned copper in the form of a copper wiring layer shows elastic deformation at a temperature in the range of a room temperature to 400 degrees centigrade, and a residual tensile stress at a room temperature is higher than the same in FIG. 4. Accordingly, it would be necessary to anneal copper at a temperature lower than a temperature at which copper is annealed in the first and second embodiments, in order to relax a residual tensile stress to the same degree as the first and second embodiments, in the third embodiment in which the cooling step is carried out after copper is patterned into a wiring layer.

Hence, the inventor conducted the experiments in which copper was cooled down to various temperatures. In view of the results of the experiments, it was found out that it would be possible to relax a residual tensile stress to a degree to prevent disconnection between upper and lower wiring layers, caused by voids, if copper was cooled down to −100 degrees centigrade or lower, and preferably down to −196 degrees centigrade or lower. Herein, "−196 degrees centigrade" means a temperature of liquid nitrogen.

Thus, the inventor further conducted the experiment in which the step of cooling the copper down to −100 degrees centigrade or lower was carried out at least once after any one of the above-mentioned steps (A) to (D) had been carried out. The result was that it was possible to lower a failure rate of the semiconductor device fabricated in accordance with the third embodiment by about one figure relative to a failure rate of the semiconductor device fabricated in accordance with a conventional method, similarly to the first and second embodiments.

In addition, it was also possible to reduce the number of fabrication steps, since a residual tensile stress can be reduced by carrying out the cooling step once regardless of the number of wiring layers in the third embodiment.

As mentioned above, the method in accordance with the third embodiment makes it possible to reduce a residual tensile stress generated in copper by annealing, by carrying out the above-mentioned cooling step at least once after a multi-layered wiring structure has been fabricated. As a result, it is possible to prevent disconnection between upper and lower wiring layers, and further prevent reduction in a resistance to electromigration.

The third embodiment is applied to a dual damascene process, however, it should be noted that the third embodiment may be applied to a single damascene process.

In the above-mentioned first to third embodiments, the present invention is applied to a damascene process. However, it should be noted that the present invention may be applied to a structure in which soft metal such as copper exists in a hard material such as a silicon dioxide film, or a semiconductor device including such a structure, in order to relax a stress generated in the soft metal.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-077625 filed on Mar. 20, 2001 including specification, claims, drawings and summary is incorporated herein by reference in its entirety.

What is claimed is:

1. A method of fabricating a semiconductor device, including at least the steps of:
   (a) forming a via-hole or trench throughout an electrically insulating layer;
   (b) forming a wiring material layer on said electrically insulating layer such that said via-hole or trench is filled with said wiring material layer;
   (c) annealing said wiring material layer;
   (d) compulsorily cooling said wiring material layer down to a temperature equal to or lower than a predetermined temperature, wherein said predetermined temperature is selected from the group consisting of equal to or about −75 degrees centigrade, equal to or about −100 degrees centigrade, and equal to or about −196 degrees centigrade; and
   (e) applying chemical mechanical polishing (CMP) to said wiring material layer such that said wiring material layer exists only in said via-hole or trench, wherein said step (c) is carried out prior to said step (e), and said step (d) is carried out after said step (c).

2. The method as set forth in claim 1, wherein said predetermined temperature is equal to about −75 degrees centigrade, and said step (d) is carried out after said step (c), but prior to said step (e).

3. The method as set forth in claim 2, wherein said step (c) is carried out at 200 degrees centigrade or higher.

4. The method as set forth in claim 1, wherein said predetermined temperature is equal to about −100 degrees centigrade, and said step (d) is carried out after said step (e).

5. The method as set forth in claim 4, wherein said step (c) is carried out at 200 degrees centigrade or higher.

6. The method as set forth in claim 1, wherein said predetermined temperature is equal to about −196 degrees centigrade, and said step (d) is carried out after said step (e).

7. The method as set forth in claim 6, wherein said step (c) is carried out at 200 degrees centigrade or higher.

8. The method of claim 1, with the cooling step performed in an annealing apparatus equipped with a cooler, or with the cooling step performed in an apparatus separate from where the annealing step was performed.

9. The method of claim 1, with the cooling step is performed in an apparatus having an ability of cooling an object in vacuum or in inert gas atmosphere.

10. A method of fabricating a semiconductor device, including at least the steps in sequence, of:
   (a) forming an electrically insulating film on a substrate;
   (b) forming a via-hole or trench throughout said electrically insulating film;
   (c) forming a barrier metal film on an inner wall of said via-hole or trench;
   (d) depositing a material of which a wiring layer is composed, on said electrically insulating film such that said via-hole or trench is filled with said material;
   (e) annealing a resultant resulted from said step (d);
   (f) compulsorily cooling a resultant resulted from the step (e) down to a temperature equal to or less than a predetermined temperature, wherein said predetermined temperature is selected from the group consisting of equal to or about −75 degrees centigrade, equal to or about −100 degrees centigrade, and equal to or about −196 degrees centigrade; and
   (g) applying chemical mechanical polishing (CMP) to said material such that said material exists only in said via-hole or trench as a wiring layer.

11. The method as set forth in claim 10, wherein said predetermined temperature is equal to about −75 degrees centigrade.

12. The method as set forth in claim 11, wherein said step (e) is carried out in the range of 200 degrees centigrade to 400 degrees centigrade both inclusive.

13. The method as set forth in claim 10, wherein said predetermined temperature is equal to about −100 degrees centigrade.

14. The method as set forth in claim 13, wherein said step (e) is carried out in the range of 200 degrees centigrade to 400 degrees centigrade both inclusive.

15. The method as set forth in claim 10, wherein said predetermined temperature is equal to about −196 degrees centigrade.

16. The method as set forth in claim 15, wherein said step (e) is carried out in the range of 200 degrees centigrade to 400 degrees centigrade both inclusive.

17. The method as set forth in claim 10, wherein said material is selected from a group consisting of copper (Cu) and tungsten (W), and said barrier metal film is comprised of a layer composed of a material selected from a group consisting of Ti, TiN, Ta, TaN and WN, or a multi-layered structure including at least two layers each composed of a material selected from a group consisting of Ti, TiN, Ta, TaN and WN.

18. A method of fabricating a semiconductor device, including at least the steps, in sequence, of:
   (a) forming first to N-th electrically insulating films on a substrate wherein N is an integer equal to or greater than two (2);
   (b) forming a via-hole or trench throughout said first to N-th electrically insulating films;
   (c) forming trenches throughout second to N-th electrically insulating films;
   (d) forming barrier metal films on inner walls of said via-hole or trench and said trenches;
   (e) depositing a material of which a wiring layer is composed, on said N-th electrically insulating film such that said via-hole or trench and said trenches are filled with said material;
   (f) annealing a resultant resulted from said step (e);
   (g) compulsorily cooling a resultant resulted from said step (f) down to a temperature equal to or less than a predetermined temperature, wherein said predetermined temperature is selected from the group consisting of equal to or about −75 degrees centigrade, equal to or about −100 degrees centigrade, and equal to or about −196 degrees centigrade; and
   (h) applying chemical mechanical polishing (CMP) to said material such that said material exists only in said via-hole or trench and said trenches as wiring layers.

19. The method as set forth in claim 18, wherein said predetermined temperature is equal to about −75 degrees centigrade.

20. The method as set forth in claim 19, wherein said step (e) is carried out in the range of 200 degrees centigrade to 400 degrees centigrade both inclusive.

21. The method as set forth in claim 18, wherein said predetermined temperature is equal to about −100 degrees centigrade.

22. The method as set forth in claim 21, wherein said step (e) is carried out in the range of 200 degrees centigrade to 400 degrees centigrade both inclusive.

23. The method as set forth in claim 18, wherein said predetermined temperature is equal to about −196 degrees centigrade.

24. The method as set forth in claim 23, wherein said step (e) is carried out in the range of 200 degrees centigrade to 400 degrees centigrade both inclusive.

25. The method as set forth in claim 18, wherein said material is selected from a group consisting of copper (Cu) and tungsten (W), and said barrier metal film is comprised of a layer composed of a material selected from a group consisting of Ti, TiN, Ta, TaN and WN, or a multi-layered structure including at least two layers each composed of a material selected from a group consisting of Ti, TIN, Ta, TaN and WN.

26. A method of fabricating a semiconductor device, including at least the steps of:
   (a) forming an electrically insulating film on a substrate;
   (b) forming a via-hole or trench throughout said electrically insulating film;
   (c) forming a barrier metal film on an inner wall of said via-hole or trench;
   (d) depositing a material of which a wiring layer is composed, on said electrically insulating film such that said via-hole or trench is filled with said material;
   (e) annealing a resultant resulted from said step (d);
   (f) applying chemical mechanical polishing (CMP) to said material such that said material exists only in said via-hole or trench as a wiring layer; and
   (g) compulsorily cooling a resultant resulted from step (f) down to a temperature equal to or less than a predetermined temperature, wherein said predetermined temperature is selected from the group consisting of equal to or about −100 degrees centigrade, and equal to or about −196 degrees centigrade,
   wherein said step (g) is carried out at least once after said step (f), but prior to a step of packaging a resultant.

27. The method as set forth in claim 26, wherein said predetermined temperature is equal to about −100 degrees centigrade.

28. The method as set forth in claim 27, wherein said step (e) is carried out in the range of 200 degrees centigrade to 400 degrees centigrade both inclusive.

29. The method as set forth in claim 26, wherein said predetermined temperature is equal to about −196 degrees centigrade.

30. The method as set forth in claim 29, wherein said step (e) is carried out in the range of 200 degrees centigrade to 400 degrees centigrade both inclusive.

31. The method as set forth in claim 26, wherein said material is selected from a group consisting of copper (Cu) and tungsten (W), and said barrier metal film is comprised of a layer composed of a material selected from a group consisting of Ti, TlN, Ta, TaN and WN, or a multi-layered structure including at least two layers each composed of a material selected from a group consisting of Ti, TiN, Ta, TaN and WN.

32. A method of fabricating a semiconductor device, including at least the steps of:
  (a) forming first to N-th electrically insulating films on a substrate wherein N is an integer equal to or greater than two (2);
  (b) forming a via-hole or trench throughout said first to N-th electrically insulating films;
  (c) forming trenches throughout second to N-th electrically insulating films;
  (d) forming barrier metal films on inner walls of said via-hole or trench and said trenches;
  (e) depositing a material of which a wiring layer is composed, on said N-th electrically insulating film such that said via-hole or trench and said trenches are filled with said material;
  (f) annealing a resultant resulted from said step (e);
  (h) applying chemical mechanical polishing (CMP) to said material such that said material exists only in said via-hole or trench and said trenches as wiring layers; and
  (g) compulsorily cooling a resultant resulted from step (h) down to a temperature equal to or less than a predetermined temperature, wherein said predetermined temperature is selected from the group consisting of equal to or about −100 degrees centigrade, and equal to or about −196 degrees centigrade,
  wherein said step (g) is carried out at least once after said step (f), but prior to a step of packaging a resultant.

33. The method as set forth in claim 32, wherein said predetermined temperature is equal to about −100 degrees centigrade.

34. The method as set forth in claim 33, wherein said step (e) is carried out in the range of 200 degrees centigrade to 400 degrees centigrade both inclusive.

35. The method as set forth in claim 32, wherein said predetermined temperature is equal to about −196 degrees centigrade.

36. The method as set forth in claim 35, wherein said step (e) is carried out in the range of 200 degrees centigrade to 400 degrees centigrade both inclusive.

37. The method as set forth in claim 32, wherein said material is selected from a group consisting of copper (Cu) and tungsten (W), and said barrier metal film is comprised of a layer composed of a material selected from a group consisting of Ti, TiN, Ta, TaN and WN, or a multi-layered structure including at least two layers each composed of a material selected from a group consisting of Ti, TiN, Ta, TaN and WN.

* * * * *